(12) United States Patent
Jun et al.

(10) Patent No.: US 10,361,090 B2
(45) Date of Patent: Jul. 23, 2019

(54) VERTICAL CHANNEL TRANSISTORS FABRICATION PROCESS BY SELECTIVE SUBTRACTION OF A REGULAR GRID

(71) Applicant: INTEL CORPORATION, Santa Clara, CA (US)

(72) Inventors: Kimin Jun, Hillsboro, OR (US); Patrick Morrow, Portland, OR (US); Donald Nelson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 56 days.

(21) Appl. No.: 15/120,720

(22) PCT Filed: Sep. 24, 2014

(86) PCT No.: PCT/US2014/057257
§ 371 (c)(1),
(2) Date: Aug. 22, 2016

(87) PCT Pub. No.: WO2015/191096
PCT Pub. Date: Dec. 17, 2015

(65) Prior Publication Data
US 2017/0011929 A1 Jan. 12, 2017

Related U.S. Application Data

(60) Provisional application No. 62/012,176, filed on Jun. 13, 2014.

(51) Int. Cl.
*H01L 21/308* (2006.01)
*H01L 29/66* (2006.01)
(Continued)

(52) U.S. Cl.
CPC ...... *H01L 21/3086* (2013.01); *H01L 21/3081* (2013.01); *H01L 21/76802* (2013.01);
(Continued)

(58) Field of Classification Search
CPC combination set(s) only.
See application file for complete search history.

(56) References Cited

U.S. PATENT DOCUMENTS

2006/0019174 A1 1/2006 Ahn et al.
2006/0073694 A1* 4/2006 Chang ............... H01L 21/762
438/618
(Continued)

FOREIGN PATENT DOCUMENTS

CN 101416317 A 4/2009
CN 101908544 A 12/2010
(Continued)

OTHER PUBLICATIONS

PCT International Search Report and Written Opinion for counterpart Application No. PCT/US2014/057257, dated Feb. 27, 2015, (9 pages).
(Continued)

*Primary Examiner* — Ratisha Mehta
(74) *Attorney, Agent, or Firm* — Schwabe, Williamson & Wyatt, P.C.

(57) ABSTRACT

A grid comprising a first set of grid lines and a second set of grid lines is formed on a substrate using a first lithography process. At least one of the first set of grid lines and the second set of grid lines are selectively patterned to define a vertical device feature using a second lithography process.

7 Claims, 25 Drawing Sheets

(51) Int. Cl.
  *H01L 29/78* (2006.01)
  *H01L 21/768* (2006.01)
  *H01L 29/06* (2006.01)
(52) U.S. Cl.
  CPC .... *H01L 29/66666* (2013.01); *H01L 29/7827* (2013.01); *H01L 29/0676* (2013.01)

(56) References Cited

U.S. PATENT DOCUMENTS

| 2011/0003253 A1 | 1/2011 | Miyamoto |
| 2012/0208361 A1 | 8/2012 | Ha |
| 2013/0200498 A1 | 8/2013 | Mangan |
| 2014/0131813 A1 | 5/2014 | Liaw |

FOREIGN PATENT DOCUMENTS

| EP | 1818977 | | 8/2007 | |
| EP | 1818977 A2 * | | 8/2007 | ......... H01L 21/0337 |
| JP | 2002-175981 A | | 6/2002 | |
| JP | 2000-208434 A | | 7/2002 | |
| JP | 2003-282550 A | | 10/2003 | |
| JP | 2005-150494 A | | 6/2005 | |
| JP | 2008-235462 A | | 10/2008 | |
| JP | 2009-532904 | | 9/2009 | |
| JP | 2010-77441 A | | 11/2009 | |
| JP | 2011-258842 A | | 6/2010 | |
| JP | 2010-263139 A | | 11/2010 | |
| JP | 2010-283351 A | | 12/2010 | |
| JP | 2011-014835 | | 1/2011 | |
| JP | 2013-157498 A | | 8/2013 | |
| KR | 10-2000-0043248 | | 7/2000 | |
| KR | 10-2012-0092983 | | 8/2012 | |
| TW | 201419451 | | 5/2014 | |

OTHER PUBLICATIONS

Taiwan Office Action and Search Report for counterpart Taiwan Application No. 104114301, dated Apr. 26, 2016, with English translation (4 pages).
International Prliminary Report on Patentabiliy for Application No. PCT/US2014/057257 dated Dec. 22, 2016, 6 pages.
Search Report & Written Opinion for European Patent Application No. 14894206.3, dated Feb. 22, 2018, 9 pages.
Office Action from Japanese Patent Application No. 2016-565657 dated Aug. 14, 2018, 7 pgs.
Notice of Allowance for Taiwan Patent Application No. 104114301, dated Aug. 18, 2016, 2 pgs.
Office Action from Chinese Patent Application No. 201480078811. 1, dated Dec. 29, 2018, 9 pgs.
Office Action from Japanese Patent Application No. 2016-565657, dated Mar. 5, 2019, 5 pgs.

* cited by examiner (a) Bitcell (b) Inverter

VERTICAL CHANNEL TRANSISTORS FABRICATION PROCESS BY SELECTIVE SUBTRACTION OF A REGULAR GRID

CROSS-REFERENCE TO RELATED APPLICATIONS

This patent application is a U.S. National Phase Application under 35 U.S.C. § 371 of International Application No. PCT/US2014/057257, filed Sept. 24, 2014, entitled "VERTICAL CHANNEL TRANSISTORS FABRICATION PROCESS BY SELECTIVE SUBTRACTION OF A REGULAR GRID", which claims the benefit of prior U.S. Provisional Patent Application No. 62/012,176, entitled "VERTICAL CHANNEL TRANSISTORS FABRICATION PROCESS BY SELECTIVE SUBTRACTION OF A REGULAR GRID" filed on Jun. 13, 2014, which are hereby incorporated by reference in their entirety.

FIELD

Embodiments of the invention relate to the field of electronic device manufacturing; and more specifically, to vertical device fabrication.

BACKGROUND

As geometries of the electronic devices shrink, lithography and patterning at advanced process node for planar and non-planar designs become more challenging. Generally, a gate-all-around transistor refers to the transistor having the gate material that surrounds the channel region on all sides. A vertical channel transistor is an example of the gate-all-around transistor. A vertical channel transistor is a promising candidate for semiconductor device architecture, as the gate all around structure provides improved gate control on the channel. The gate-all-around transistors can be built around nanowires, for example, silicon nanowires and InGaAs nanowires.

To maximize the gate control, an individual nanowire of the vertical transistor typically has smaller diameter than the gate length. Therefore, vertical channel transistors and integrated circuits need finer patterning process compared to horizontal channel devices.

The lithography becomes even more complicated and sophisticated on vertical channel devices due to their finer patterning requirement. This causes significant design rule limitation on patterns which can be printed, and leads to high manufacturing cost.

BRIEF DESCRIPTION OF THE DRAWINGS

Embodiments of the invention may best be understood by referring to the following description and accompanying drawings that are used to illustrate embodiments of the invention. In the drawings.

DETAILED DESCRIPTION

Figures 1A, 1B:
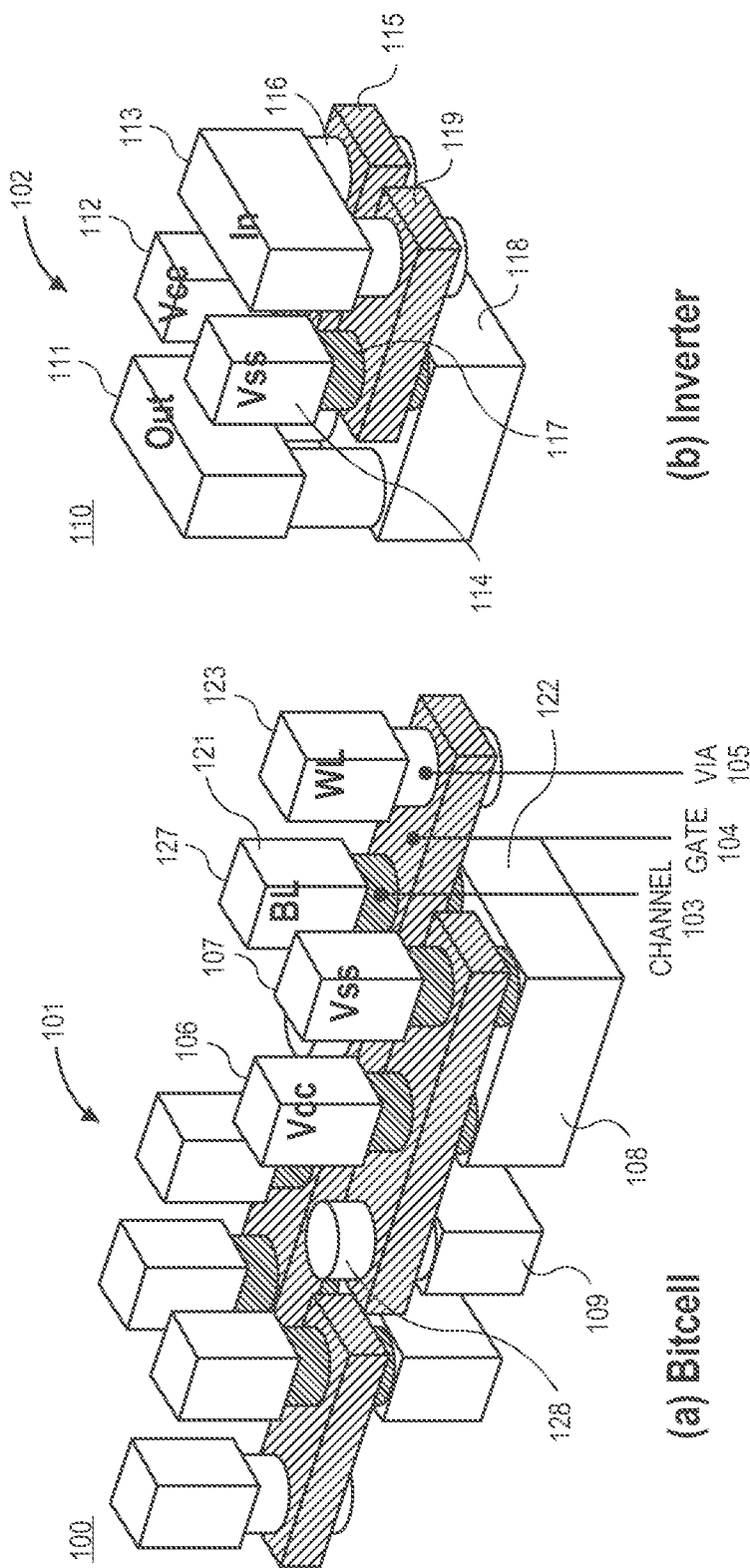
FIG. 1A is a perspective view illustrating a vertical electronic device structure according to one embodiment.
FIG. 1B is a perspective view illustrating a vertical electronic device structure according to one embodiment.

Described herein are systems and methods to manufacture a vertical device. A grid comprising a first set of grid lines and a second set of grid lines is formed on a substrate using a first lithography process. A vertical device feature is defined by patterning at least one of the first set of grid lines and the second set of grid lines using a second lithography process.

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Implementations of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. The wrap-around or all-around gate transistors may be vertical transistors. In an embodiment, although some implementations described herein may illustrate vertical transistors, it should be noted that the invention may also be carried out using other than vertical transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some embodiments, the gate electrode may consist of a "U"-shaped structure that includes a bottom portion substantially parallel to the surface of the substrate and two sidewall portions that are substantially perpendicular to the top surface of the substrate. In another embodiments, at least one of the metal layers that form the gate electrode may simply be a planar layer that is substantially parallel to the top surface of the substrate and does not include sidewall portions substantially perpendicular to the top surface of the substrate. In further embodiments, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of spacers may be formed on opposing sides of the gate stack that bracket the gate stack. The spacers may be formed from a material such as silicon nitride, silicon oxide, silicon carbide, silicon nitride doped with carbon, and silicon oxynitride. Processes for forming spacers are well known in the art and generally include deposition and etching process steps. In an alternate implementation, a plurality of spacer pairs may be used, for instance, two pairs, three pairs, or four pairs of spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1A is a perspective view 100 illustrating a vertical electronic device structure 101 according to one embodiment. The vertical electronic structure 101 can be formed using methods and apparatuses as described in further detail below with respect to FIGS. 2A-2C, and 3A-3S. The vertical electronic device structure 101 comprises a substrate 108. Substrate 108 can be one of the substrates described above. In one embodiment, substrate 108 includes a monocrystalline silicon (Si), germanium (Ge), silicon germanium (SiGe), a III-V materials, e.g., GaAs, InSb, GaP, GaSb based materials, carbon nanotubes based materials, or any combination thereof. In one embodiment, the substrate 108 comprises a single crystalline material substrate, e.g., monocrystalline silicon substrate. In one embodiment, the substrate 108 comprises a polycrystalline material substrate. In an embodiment, substrate 108 includes interconnects, for example, vias, configured to connect to one or more metallization layers.

In one embodiment, substrate 108 is a semiconductor-on-isolator (SOI) substrate including a bulk lower substrate, a middle insulation layer, and a top monocrystalline layer. The top monocrystalline layer may comprise any material listed above for the bulk monocrystalline substrate. A plurality of devices are formed on substrate 108, e.g., vertical transistors 106, 107, 127, interconnects, such as vertical interconnects 105 and 128. In an embodiment, electronic device structure 101 comprises a bitcell. As shown in FIG. 1A, via 105 is has a contact region to connect to a word line (WL), transistor 127 has a contact region 121 to connect to bitline (BL); transistor 106 has a contact region to connect to Vcc power supply voltage, and transistor 107 has a contact region to connect to Vss power supply voltage.

The devices are separated by electrically insulating trench layers, e.g., an insulating layer 109 to isolate one electronic device from other devices on substrate 108. Trench isolation layers are known to one of ordinary skill in the art of electronic device manufacturing.

In one embodiment, the electrically insulating layer 109 comprises an interlayer dielectric (ILD), e.g., silicon dioxide. In one embodiment, the electrically insulating layer 109 includes polyimide, epoxy, photodefinable materials, such as benzocyclobutene (BCB), and WPR-series materials, or glass. In one embodiment, the electrically insulating layer 109 is a low permittivity (low-k) ILD layer. Typically, low-k is referred to the dielectrics having dielectric constant (permittivity k) lower than the permittivity of silicon dioxide.

The vertical transistor 127 comprises a vertical channel region (e.g., nanowire) 103 surrounded by a gate electrode 104, and contact regions 121 and 122. As shown in FIG. 1A, the channel (nanowire) diameter is smaller than the length of the gate electrode. In an embodiment, the diameter of the channel region is less than 10 nanometers. The overall pitch of the vertical device structure 100 is tighter than that of horizontal devices where the longer gate-length direction is in-plane. Therefore, this tight pitch may raise patterning and overlay issues under conventional fabrication process in which the features are directly defined by the lithographic mask pattern. Embodiments described herein provide a vertical device patterning that involves forming a grid comprising a first set of grid lines and a second set of grid lines on a substrate using a first lithography process, and then selectively patterning the first set of grid lines and the second set of grid lines to define a vertical device using a second lithography process, as described in further detail below with respect to FIGS. 2A-2C, and 3A-3S. In one embodiment, the regular grid is selectively subtracted so to define vertical devices, e.g., transistors, vias and gate trenches. In an embodiment, a regular grid comprising a first set of grid lines and a second set of grid lines are printed on the entire wafer. Once the regular grid lines are formed in the whole wafer, finer patterning, e.g., an electron beam lithography, extreme ultraviolet (EUV) lithography, or any combination thereof, is used to locally define the propriety designs. That is, instead of using an expensive sophisticated lithography technique from the beginning of the patterning process, inexpensive global patterning is combined with more expensive local patterning. Because most of the backbone structure is defined during grid fabrication, finer patterning does not need large area patterning. Therefore, this enables the use of slow lithography techniques without losing productivity. Also, the features formed from the same fabric are intrinsically self-aligned, so critical overlay requirements (e.g., transistors and gate trenches) can be readily met.

Referring back to FIG. 1A, a gate dielectric layer (not shown) is deposited on the channel region 103 adjacent to gate electrode 104. A gate electrode 104 is deposited on the gate dielectric layer on channel region 103. The gate dielectric layer can be any well-known gate dielectric layer, as described above. In one embodiment, the gate dielectric layer comprises a high-k dielectric material having a dielectric constant greater than the dielectric constant of silicon dioxide. In one embodiment, the gate dielectric layer comprises a metal oxide dielectric. For example, the gate dielectric layer can be but not limited to tantalum pentaoxide ($Ta_2O_5$), and titanium oxide ($TiO_2$) zirconium oxide ($ZrO_2$), hafnium oxide ($HfO_2$), lanthanum oxide ($La_2O_4$), lead zirconium titanate (PZT), other high-k dielectric material, or a combination thereof.

In an embodiment, the gate dielectric layer is a silicon dioxide ($SiO_2$), silicon oxynitride ($SiO_x N_y$) or a silicon nitride ($Si_3 N_4$) dielectric layer. In an embodiment, the thickness of the gate dielectric layer is in the approximate range between about 2 Å to about 100 Å.

Gate electrode 104 can be formed of any suitable gate electrode material, as described above. In an embodiment, gate electrode 104 comprises of polycrystalline silicon doped to a concentration density between $1 \times 10^{19}$ atoms/cm$^3$ to $1 \times 10^{20}$ atoms/cm$^3$. In an embodiment, the gate electrode can be a metal gate electrode, such as but not limited to, tungsten, tantalum, titanium, and their nitrides. It is to be appreciated, the gate electrode 104 need not necessarily be a single material and can be a composite stack of thin films, such as but not limited to a polycrystalline silicon/metal electrode or a metal/polycrystalline silicon electrode.

A contact region 121 and a contact region 122 are formed at opposite sides of the gate electrode 104. In an embodiment, contact region 121 comprises a source region, and contact region 122 comprises a drain region. In another embodiment, contact region 121 comprises a drain region, and contact region 122 comprises a source region. The source and drain regions are formed of the same conductivity type such as N-type or P-type conductivity. In an embodiment, the source and drain regions have a doping concentration of between $1 \times 10^{19}$, and $1 \times 10^{21}$ atoms/cm$^3$. The source and drain regions can be formed of uniform concentration or can include sub-regions of different concentrations or doping profiles such as tip regions (e.g., source/drain extensions). In an embodiment, the source and drain regions have the same doping concentration and profile. In an embodiment, the doping concentration and profile of the source and drain regions can vary in to obtain a particular electrical characteristic.

Generally, a portion of the transistor located between the source region and drain regions, defines a channel region of the transistor. The channel region can also be defined as the area of the nanowire surrounded by the gate electrode. At times however, the source/drain region may extend slightly beneath the gate electrode through, for example, diffusion to define a channel region slightly smaller than the gate electrode length (Lg). In an embodiment, the channel region is intrinsic or undoped. In an embodiment, the channel region is doped, for example to a conductivity level of between $1 \times 10^{16}$ to $1 \times 10^{19}$ atoms/cm$^3$. In an embodiment, when the channel region is doped it is typically doped to the opposite conductivity type of the source region and the drain region. For example, when the source and drain regions are N-type conductivity the channel region would be doped to p type conductivity. Similarly, when the source and drain regions are P type conductivity the channel region would be N-type conductivity. In this manner transistor 127 can be formed into either a NMOS transistor or a PMOS transistor respectively. The channel region can be uniformly doped or can be doped non-uniformly or with differing concentrations to provide particular electrical and performance characteristics.

FIG. 1B is a perspective view 110 illustrating a vertical electronic device structure 102 according to one embodiment. The electronic device structure 102 can be formed using methods and apparatuses as described in further detail below with respect to FIGS. 2A-2C, and 3A-3S. The electronic device structure 102 comprises a substrate 118. Substrate 118 can be one of the substrates as described above. A plurality of devices are formed on substrate 118, e.g., vertical transistors 112 and 114, and interconnects, such as vertical interconnects 111 and 116. In an embodiment, electronic device structure 102 comprises an inverter. As shown in FIG. 1B, via 116 is has a contact region to connect to an input port (In), transistor 112 has a contact region to connect to Vcc power supply voltage; transistor 117 has a contact region to connect to Vss power supply voltage, and interconnect 111 has a contact region to connect to an output port (Out). The devices are separated by electrically insulating trench layers, as described above. Vertical transistor 112 comprises a vertical channel region surrounded by a gate electrode 115, and vertical transistor 114 comprises a vertical channel region 117 surrounded by a gate electrode 119, as described above. Each of the transistors 112 and 114 has a gate dielectric layer (not shown) deposited on the channel region adjacent to the gate electrode, as described above. Each of the transistors 112 and 114 has source and drain regions formed at opposite sides of the gate electrode, as described above.

Figure 2A:
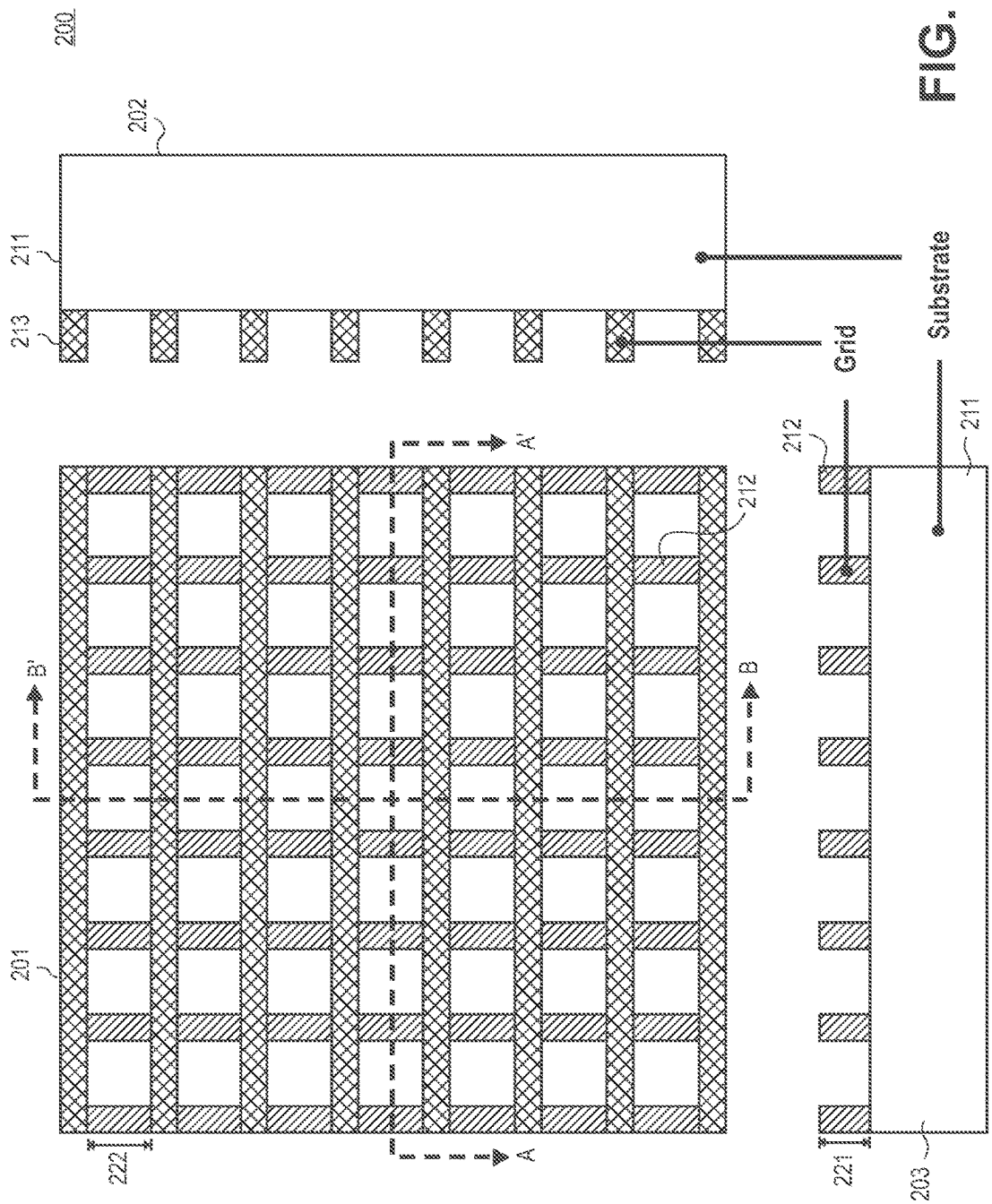
FIG. 2A shows a view illustrating an exemplary grid pre-patterned on a substrate to provide a vertical device patterning according to one embodiment.

FIG. 2A shows a view 200 illustrating an exemplary grid pre-patterned on a substrate to provide a vertical device patterning according to one embodiment. View 200 comprises a top view 201, and side views 202 and 203. A side view 203 is a view of the grid along a A-A' line, a side view 202 is a view of the grid along a B-B' line. Grid comprises a first set of grid lines 212 and a second set of grid lines 213 on a substrate 211. Substrate 211 can be one of the substrates as described above.

As shown in FIG. 2A, the first set of grid lines 212 cross the second set of lines 213 in a regular pattern. In an embodiment, the first set of grid lines 212 are substantially perpendicular to the second set of grid lines 213. In an embodiment, the grid lines 212 and 213 comprise silicon oxide, silicon nitride, silicon carbide, or other material that is selective to the material of the substrate. In an embodiment, the grid lines 212 and 213 act as a mask to form some features on the substrate 211. In an embodiment, the grid lines 212 and 213 comprise the same material. In an embodiment, the grid lines 212 and 213 comprise different materials. In an embodiment, the thickness 221 of the grid lines is defined by the height of the vertical device feature. In an embodiment, the grid lines 212 and 213 are deposited to the substrate to the thickness from about 1 nm to about 30 nm. In an embodiment, the grid lines 212 and 213 are formed using a double patterning process well known to one of ordinary skill in the art of electronic device manufacturing. In an embodiment, the grid is formed by a deep ultraviolet (DUV) lithography process (e.g., an immersion DUV lithography). Typically, DUV lithography uses laser light with wavelengths of 248 and 193 nm Generally, the immersion lithography is a technique that replaces the usual air gap between the final lens and the wafer surface with a liquid medium that has a refractive index greater than one. In embodiment, a distance 222 between the grid lines (pitch) is greater than about 10 nm. In an embodiment, the pitch is from about 20 nm to about 50 nm.

Figure 2B:
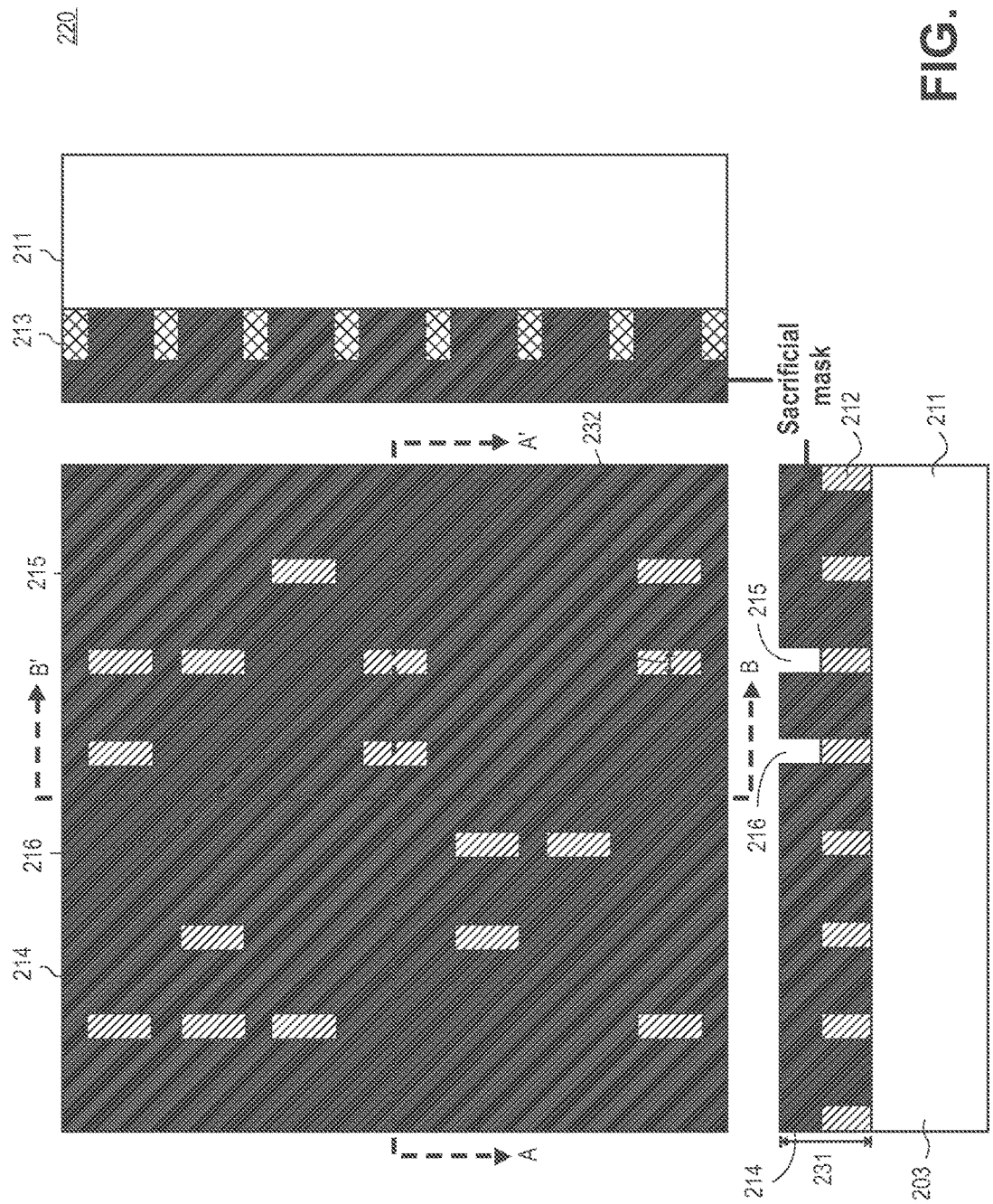
FIG. 2B is a view similar to FIG. 2A after a sacrificial hard mask layer is deposited on the grid according to one embodiment.

FIG. 2B is a view similar to FIG. 2A after a sacrificial hard mask layer 214 is deposited on the grid according to one embodiment. The sacrificial hard mask layer 214 can be deposited over the grid lines using any of hard mask deposition techniques known to one of ordinary skill in the art of electronic device manufacturing, such as but not limited to spin-on, a chemical vapour deposition (CVD) and a physical vapour deposition (PVD). In an embodiment, the sacrificial hard mask layer is deposited on the grid on the substrate to the thickness 214 from about 50 nm to about 100 nm.

In an embodiment, the sacrificial hard mask layer deposited on the grid is a carbon hard mask (CHM), a sacrificial light absorbing material (SLAM), or other material that can be selectively wet- or dry-etched over the grid and substrate materials. In an embodiment, the SLAM sacrificial hard mask layer comprises a combination of silicon oxide and polymer. In an embodiment, the CHM layer deposited on the grid is selectively dry etched over the grid and substrate materials. In an embodiment, the SLAM layer deposited on the grid is selectively wet etched over the grid and substrate materials. The sacrificial hard mask layer 214 is patterned to form openings to expose a portion of the grid. In an embodiment, the sacrificial hard mask layer 214 is patterned using an advanced lithography process that is different from the lithography that is used to form grid lines 212 and 213. In an embodiment, the sacrificial mask layer 214 is patterned using an advanced lithography, e.g., an electron beam (e-beam) lithography, extreme ultraviolet (EUV) lithography, or any combination thereof. The primary advantage of the advanced lithography is that it can draw custom patterns with sub-10 nm resolution.

The sacrificial mask layer 214 is patterned and etched to form one or more openings, such as an opening 215 to expose a portion of at least one of the first set of grid lines and the second set of grid lines to define a vertical device. In an embodiment, the size 232 of the opening formed in the sacrificial mask layer 214 is less than about 10 nm. In an embodiment, the sacrificial hard mask layer is etched using one of wet etching techniques known to one of ordinary skill in the art of electronic device manufacturing. In an embodiment, the sacrificial hard mask layer is etched using one of dry etching techniques, or a combination of wet and dry etching techniques known to one of ordinary skill in the art of electronic device manufacturing.

As shown in FIG. 2B, the sacrificial hard mask layer 214 is patterned locally, the patterning area is small relative to the size of the substrate, and the pattern is a repetition of the same (or a limited number of) openings. Therefore, advanced patterning techniques with high precision but slow speed such as EUV or e-beam can be used without substantially increasing the manufacturing cost. In an embodiment, the portions of the grid lines exposed by etching of the sacrificial hard mask layer are etched. In an embodiment, the portions of the grid lines exposed by etching of the sacrificial hard mask layer are deposited.

Figure 2C:
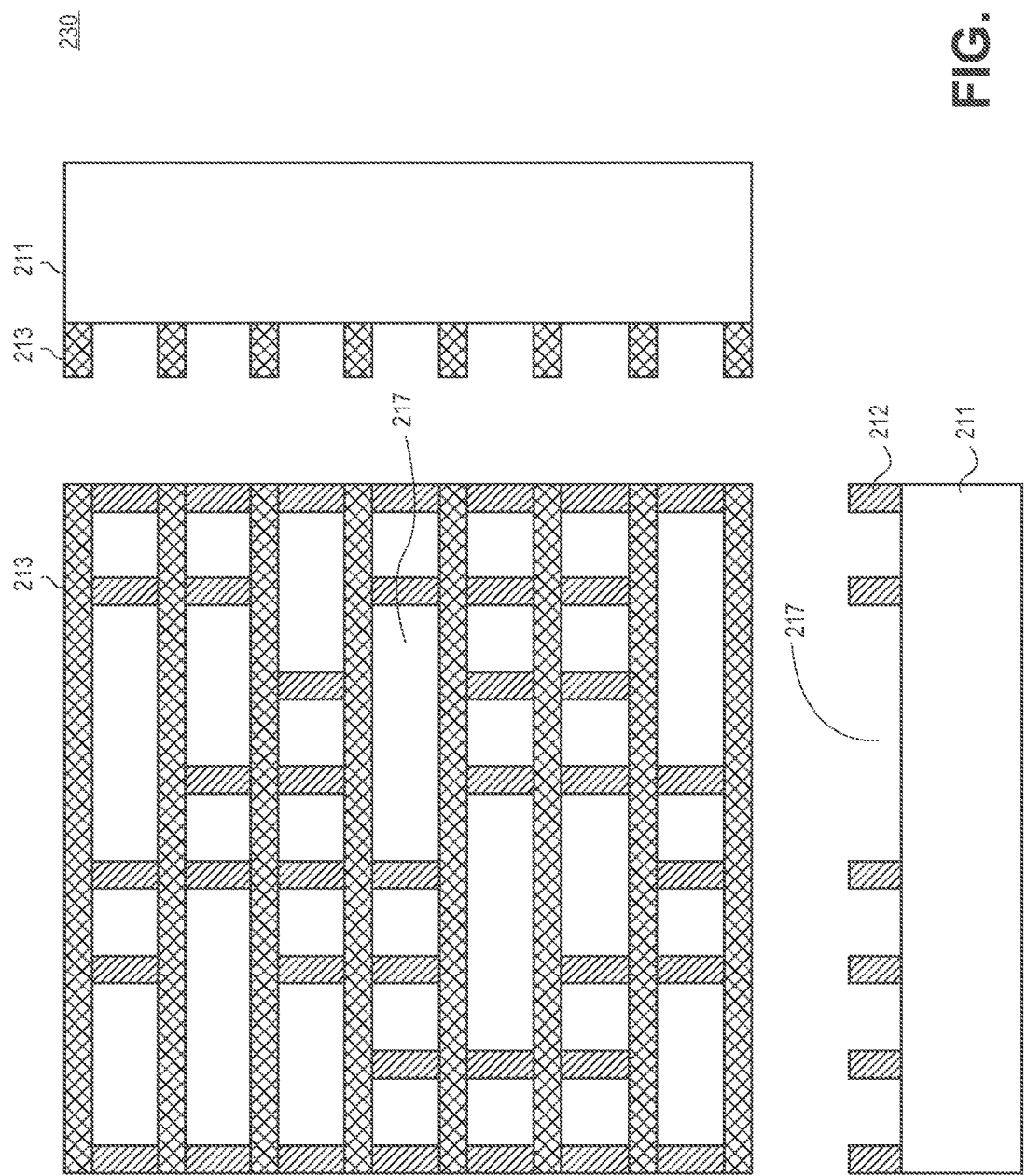
FIG. 2C is a view similar to FIG. 2B after the portions of the grid lines and the sacrificial hard mask layer are removed according to one embodiment.

FIG. 2C is a view similar to FIG. 2B after the portions of the grid lines and the sacrificial hard mask layer are removed according to one embodiment. In an embodiment, the exposed portions of the grid lines are etched through the sacrificial hard mask layer down to the substrate 211. In an embodiment, the exposed portions of the grid lines are etched using a plasma etching technique, or other dry etching technique known to one of ordinary skill in the art of electronic device manufacturing. In an embodiment, the exposed portions of the grid lines are etched using one of the wet etching techniques known to one of ordinary skill in the art of electronic device manufacturing.

In an embodiment, the sacrificial hard mask layer is removed using any of the wet techniques known to one of ordinary skill in the art of electronic device manufacturing. In an embodiment, the sacrificial hard mask layer is removed using one of the dry etching techniques known to one of ordinary skill in the art of electronic device manufacturing, e.g., a plasma etching. As shown in FIG. 2C, the patterned grid lines 212 and 213 comprise openings, e.g., an opening 217 defined by patterning the sacrificial hard mask using an advance lithography technique, as described above. The patterned grid lines 213 and 212 are used as a mask to etch a portion of the substrate to form a device feature.

Figure 3A:
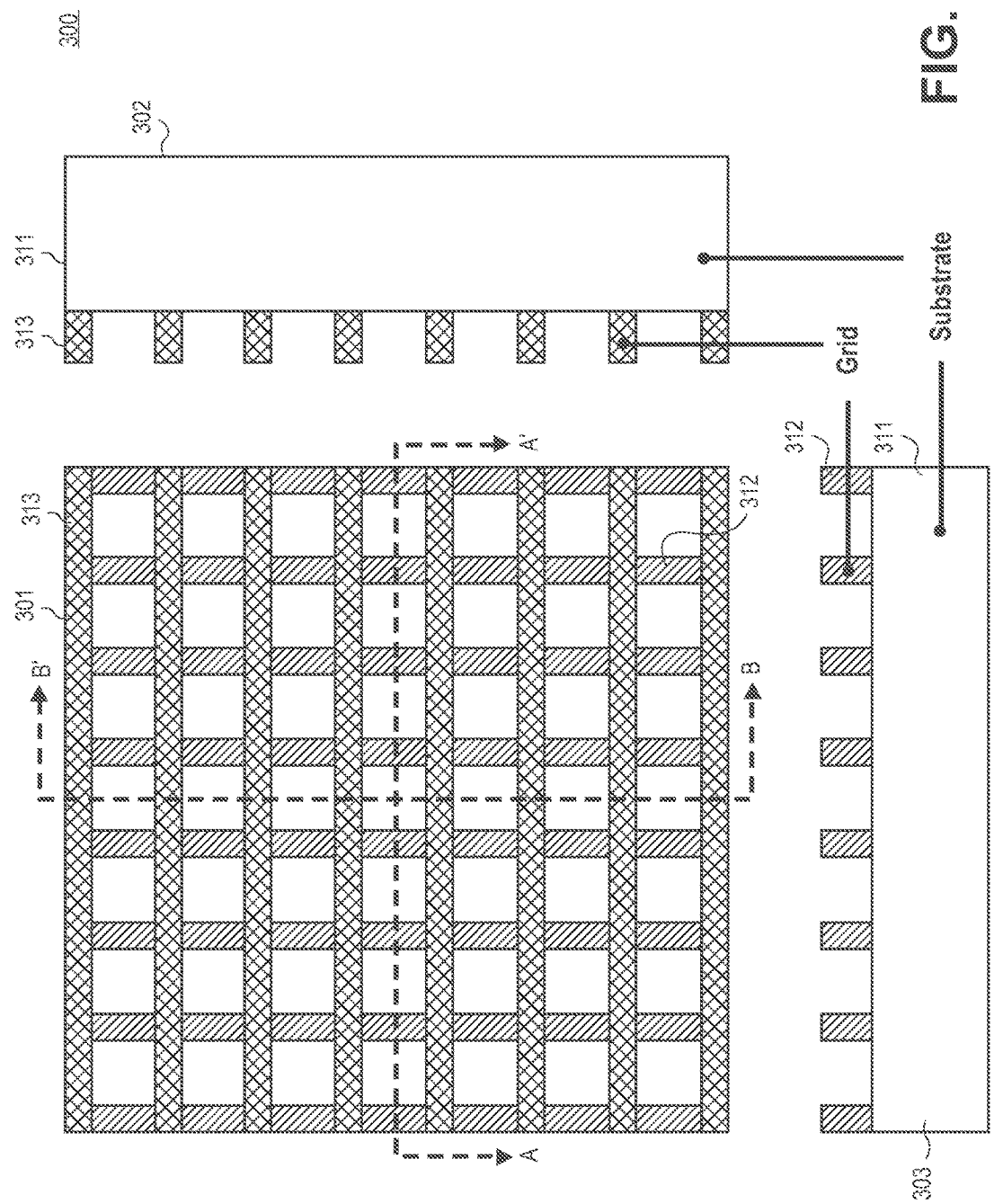
FIG. 3A shows a view illustrating an exemplary grid pre-patterned on a substrate to manufacture an electronic device structure according to another embodiment.

FIG. 3A shows a view 300 illustrating an exemplary grid pre-patterned on a substrate to manufacture an electronic device structure according to another embodiment. View 300 comprises a top view 301, and side views 302 and 303. A side view 303 is a view of the grid along a A-A' line, a side view 302 is a view of the grid along a B-B' line. Grid comprises a set of grid lines 312 and a set of grid lines 313 on a substrate 311, as described above with respect to FIG. 2A. Substrate 311 can be one of the substrates as described above. In an embodiment, the grid lines are formed on the substrate 311 using one of the lithography techniques as described above with respect to FIG. 2A.

Figure 3B:
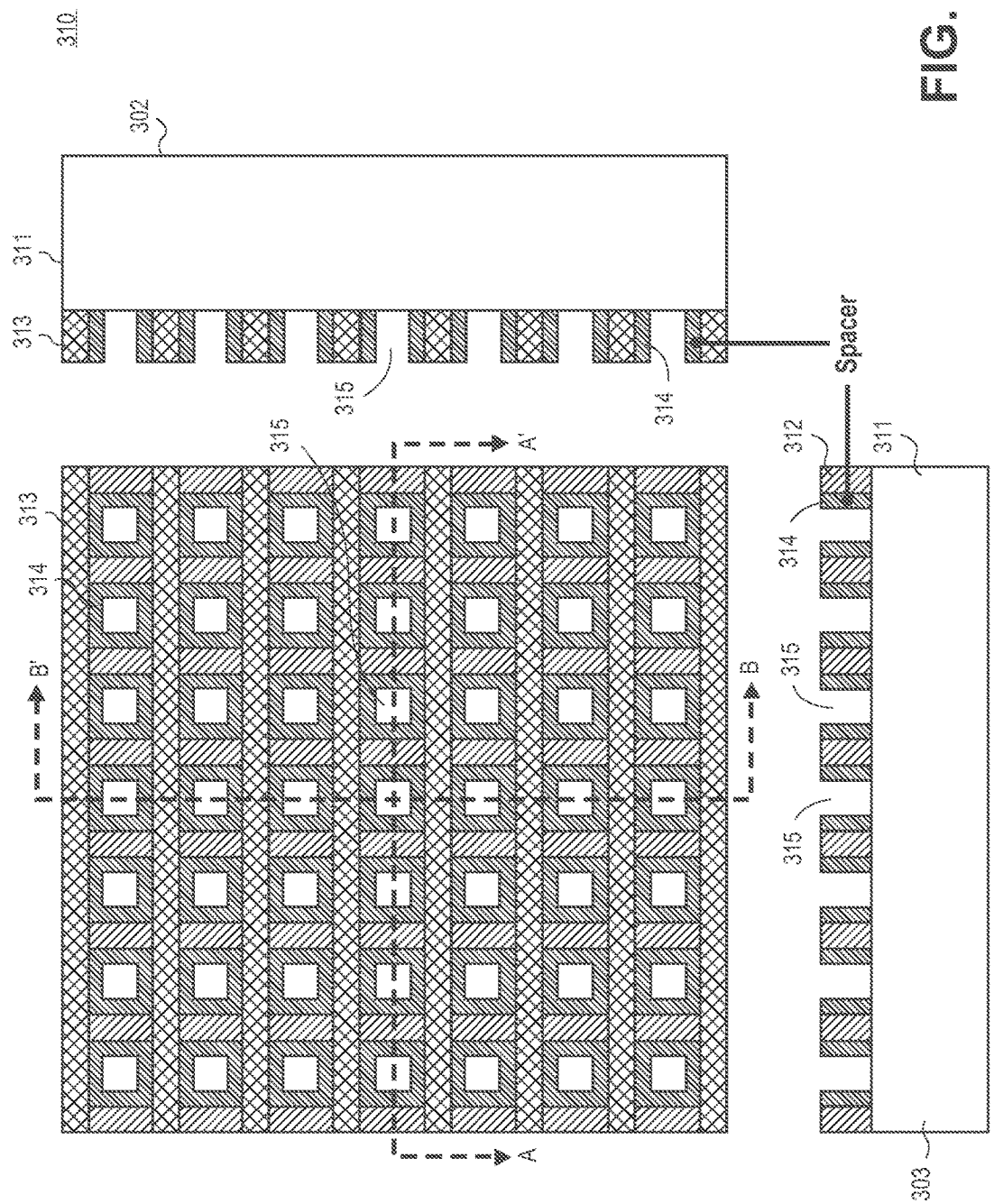
FIG. 3B is a view similar to FIG. 3A after a spacer is deposited on the grid lines and etched to expose a portion of the substrate according to one embodiment.

FIG. 3B is a view similar to FIG. 3A after a spacer is deposited on the grid lines and etched to expose a portion of the substrate according to one embodiment. A spacer 314 is conformally deposited on the grid lines 313 and 312 and the portions of the substrate 311 exposed by the grid lines 312 and 313. In an embodiment, spacer 314 is a silicon nitride, silicon oxide, titanium oxide, aluminum oxide, or other material that is different from the material of the grid lines 312 and 313. In an embodiment, the spacer is deposited on the substrate to the thickness from about 5 nm to about 10 nm. The spacer can be deposited using any conformal deposition techniques known to one of ordinary skill in the art of electronic device manufacturing. The spacer is removed from the top portions of the grid lines 312 and 313, and from the exposed portions of the substrate 311 using one of the spacer removal techniques known to one of ordinary skill in the art of electronic device manufacturing, for example, using a directional dry etch. As shown in FIG. 3B spacer 314 is adjacent to the sidewalls of the grid lines 313 and 312. An opening 315 between the spacers is formed exposing a portion of substrate 311. Spacer 314 is deposited to shrink the size of the pattern created by the grid lines 313 and 312.

Figure 3C:
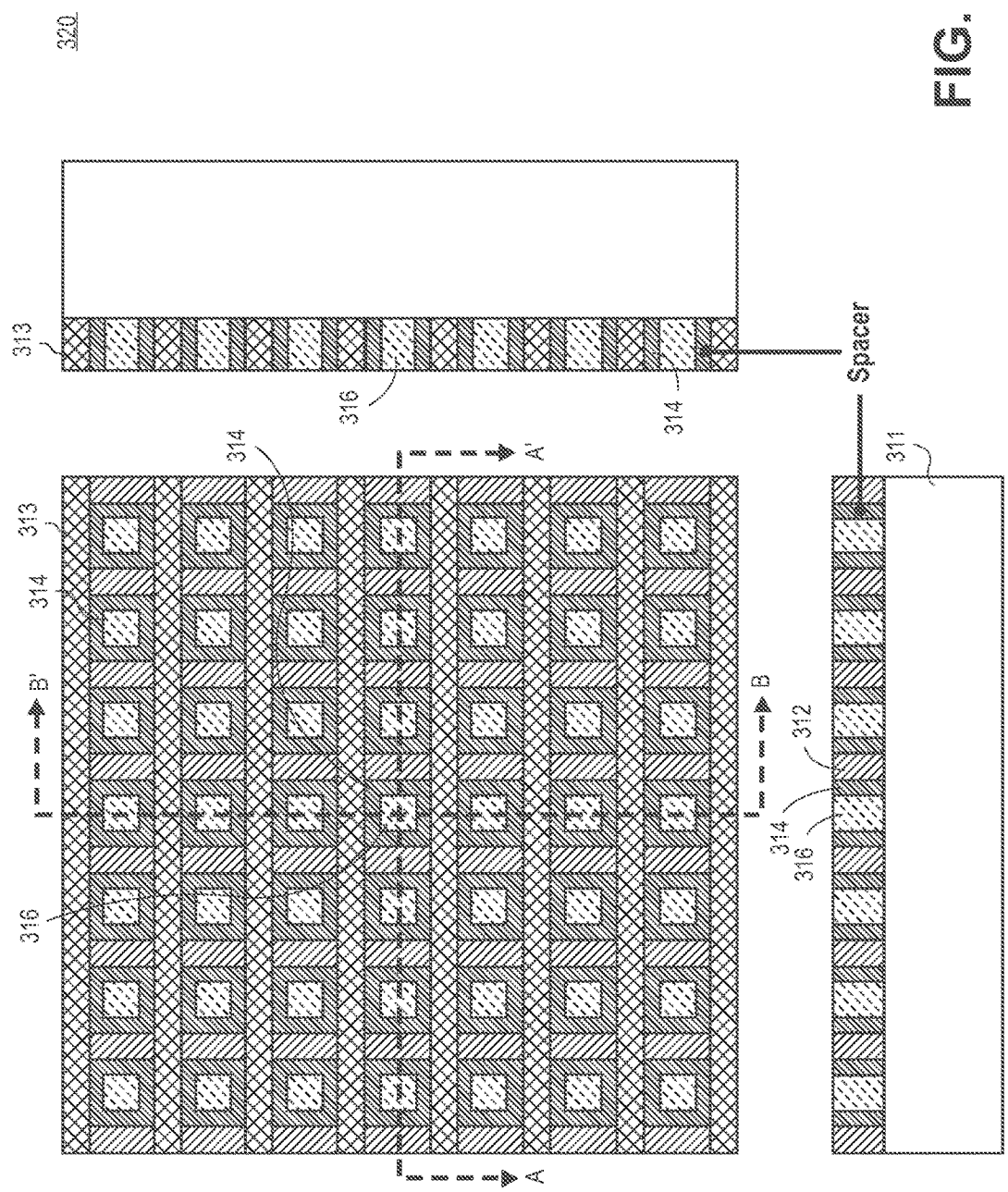
FIG. 3C is a view similar to FIG. 3B after a device hard mask is deposited on the exposed portion of the substrate according to one embodiment.

FIG. 3C is a view similar to FIG. 3B after a device hard mask 316 is deposited on the exposed portion of the substrate according to one embodiment. As shown in FIG. 3C, a device hard mask 316 is deposited though the opening 315 on the exposed portion of the substrate 311 adjacent to the sidewall of the spacer 314. In an embodiment, the size of the device hard mask 316 is determined by the size of the device feature formed on the substrate 311 later in a process. In an embodiment, device hard mask 316 is a nanowire hard mask. In an embodiment, the device hard mask comprises a silicon carbide, aluminum nitride, or other material that is selective to the substrate. The hard mask 316 can be deposited using one of the hard mask deposition techniques known to one of ordinary skill in the art of electronic device manufacturing. The device hard mask 316 is removed from the top portions of the grid lines 312 and 313 and spacer 314 using one of the hard mask removal techniques known to one of ordinary skill in the art of electronic device manufacturing, e.g., a CMP technique.

Figure 3D:
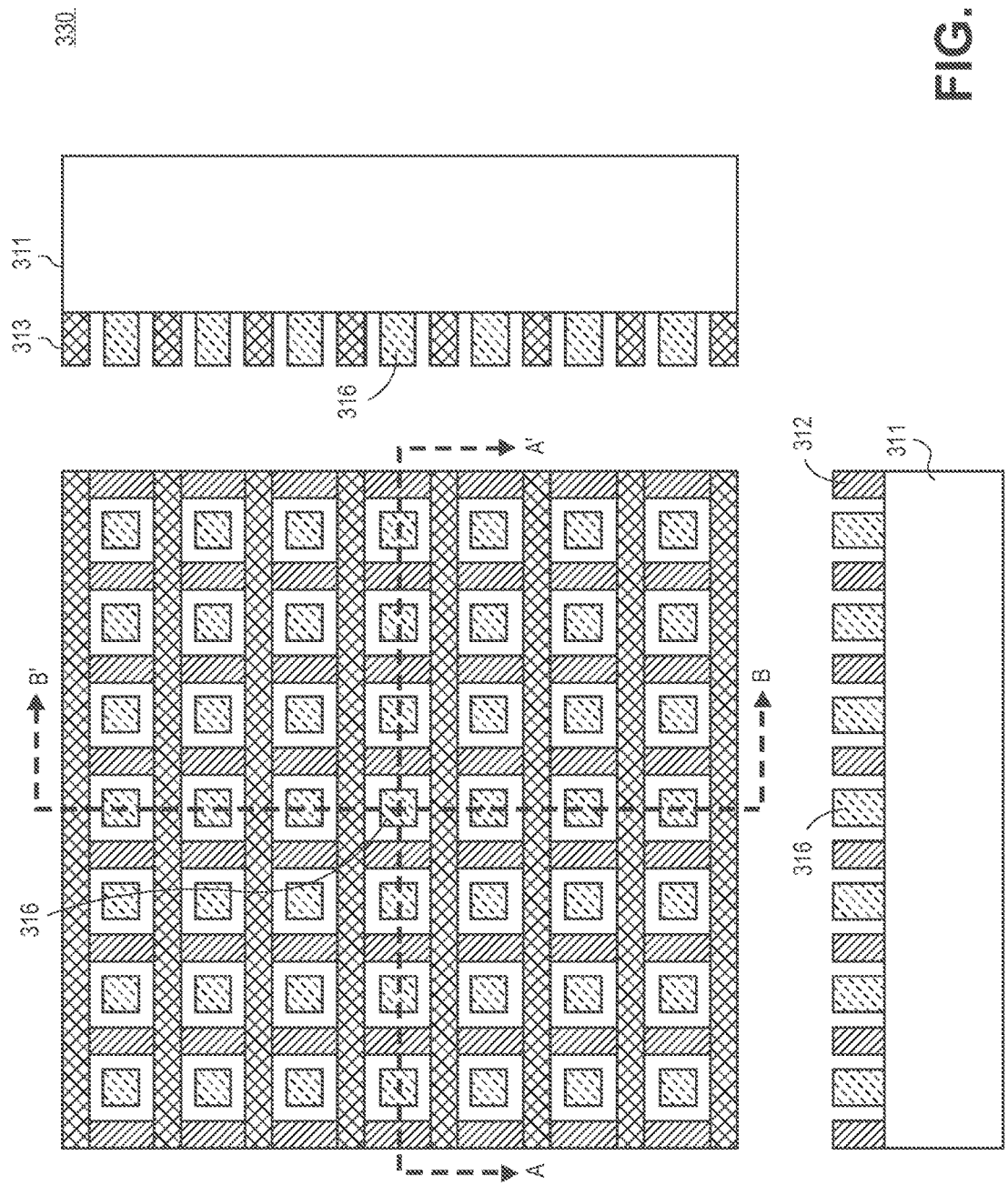
FIG. 3D is a view similar to FIG. 3C after the spacer is selectively removed according to one embodiment.

FIG. 3D is a view similar to FIG. 3C after the spacer is selectively removed according to one embodiment. In an embodiment, the spacer 314 is selectively removed from the sidewalls of the device hard mask 316, grid lines 312 and 313, and portions of the substrate 311 using one of wet etching techniques known to one of ordinary skill in the art of electronic device manufacturing. In an embodiment, the spacer 314 is a TiN spacer that is removed using sulfuric acid based wet etchant. In another embodiment, the spacer 314 is selectively removed from the sidewalls of the device hard mask 316, grid lines 312 and 313, and the portions of the substrate 311 using one of dry etching techniques known to one of ordinary skill in the art of electronic device manufacturing.

Figure 3E:
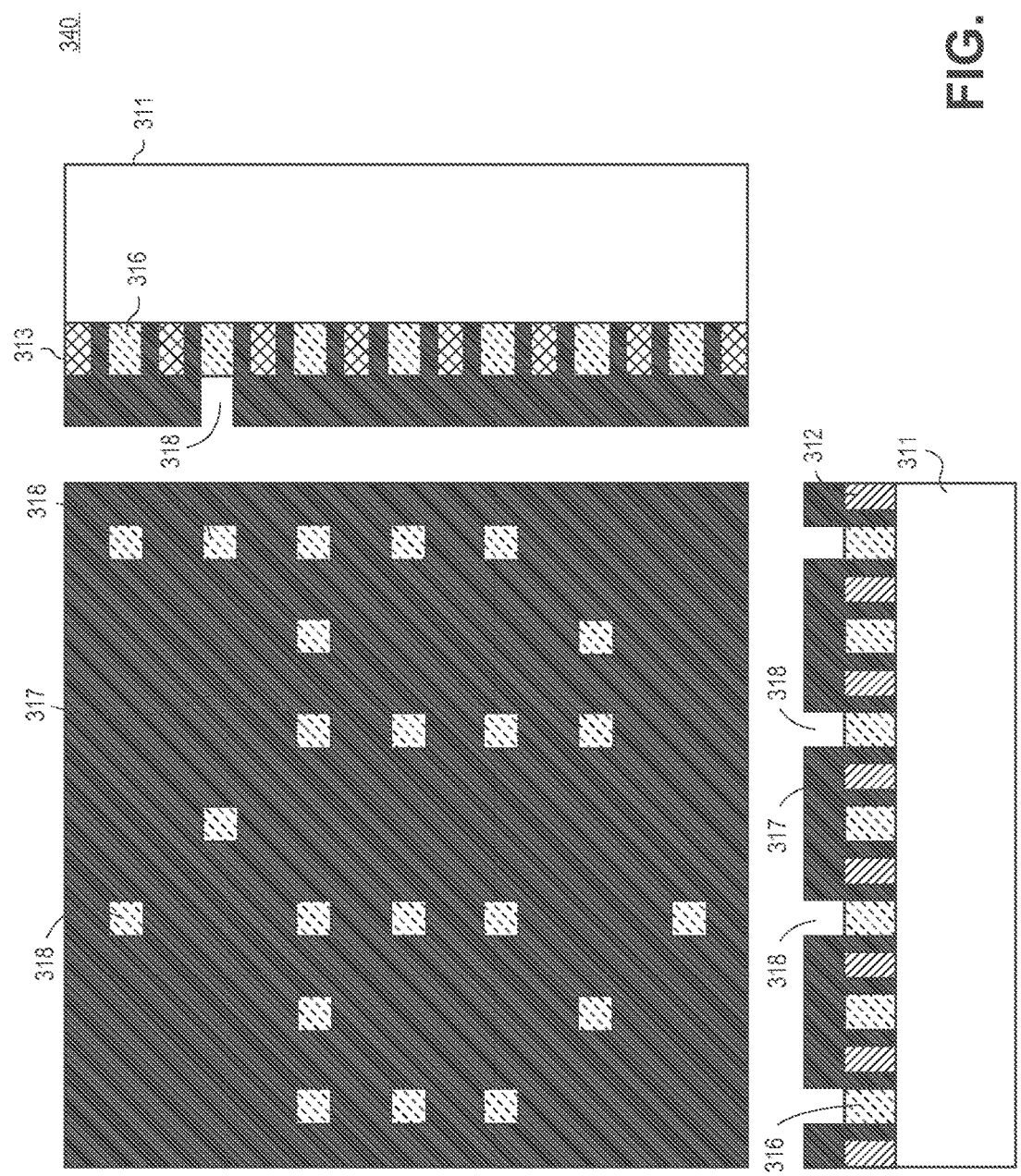
FIG. 3E is a view similar to FIG. 3D after a sacrificial hard mask is deposited and patterned over the substrate according to one embodiment.

FIG. 3E is a view similar to FIG. 3D after a sacrificial hard mask 317 is deposited and patterned over the substrate according to one embodiment. A sacrificial hard mask layer 317 is deposited on the grid lines 313, 312, device hard mask 316, and on exposed portions of the substrate 311. The sacrificial hard mask layer 317 can be deposited using any of hard mask deposition techniques known to one of ordinary skill in the art of electronic device manufacturing, as described above. In an embodiment, the sacrificial hard mask layer 317 is deposited on the substrate to the thickness from about 50 nm to about 100 nm.

In an embodiment, the sacrificial hard mask layer is a carbon hard mask. In an embodiment, the sacrificial hard mask layer is a sacrificial light absorbing material (SLAM), or other material that can be selectively wet- or dry-etched over the grid and substrate materials. In an embodiment, the CHM layer is selectively dry etched over the substrate materials. In an embodiment, the SLAM layer is selectively wet etched over the substrate materials. The sacrificial hard mask layer 317 is selectively patterned to form openings to expose a portion of the device hard mask 316. In an embodiment, the sacrificial hard mask layer 317 is patterned using an advanced lithography, e.g., an electron beam (e-beam) lithography, extreme ultraviolet (EUV) lithography, or any combination thereof, as described above.

The sacrificial mask layer 317 is patterned and etched to form one or more openings, such as an opening 318 to expose a portion of the device hard mask 316. In an embodiment, the size of the opening 318 is less than about 10 nm. In an embodiment, the size of the opening 318 is from about 1 nm to about 10 nm. In an embodiment, the sacrificial hard mask layer is etched using one of wet etching techniques known to one of ordinary skill in the art of electronic device manufacturing. In an embodiment, the sacrificial hard mask layer is etched using one of dry etching techniques, or a combination of wet and dry etching techniques known to one of ordinary skill in the art of electronic device manufacturing.

Figure 3F:
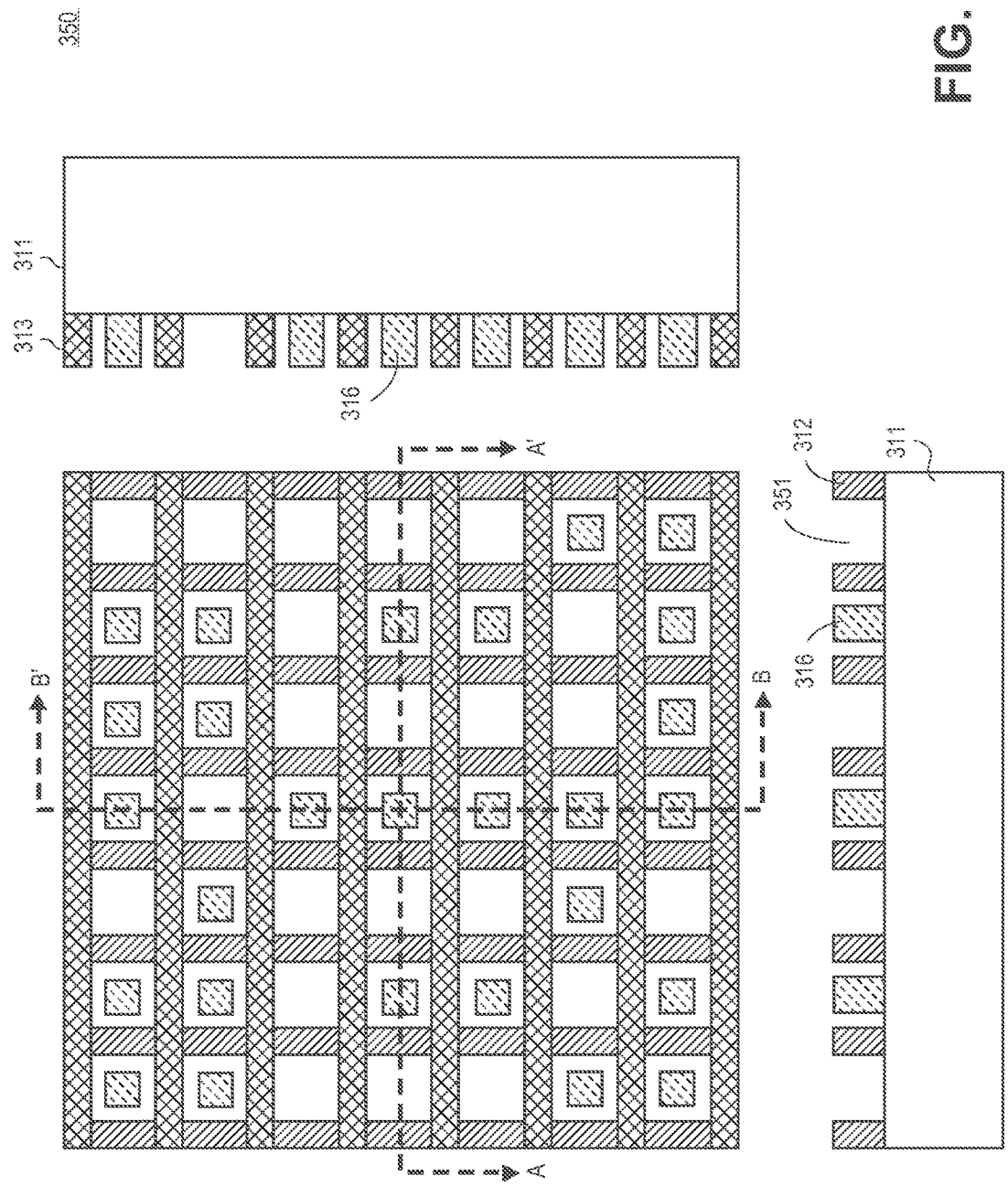
FIG. 3F is a view similar to FIG. 3D after removing the exposed portions of the device hard mask and sacrificial hard mask from the substrate according to one embodiment.

FIG. 3F is a view similar to FIG. 3D after removing the exposed portions of the device hard mask and sacrificial hard mask from the substrate according to one embodiment. In an embodiment, the exposed portions of the device hard mask 316 are etched through the sacrificial hard mask layer 317 down to the substrate 311. In an embodiment, the exposed portions of the device hard mask are etched using one of the dry etching techniques known to one of ordinary skill in the art of electronic device manufacturing. In an embodiment, the device hard mask is etched using one of the wet etching techniques known to one of ordinary skill in the art of electronic device manufacturing.

In an embodiment, the sacrificial hard mask is removed using any of the wet techniques known to one of ordinary skill in the art of electronic device manufacturing. In an embodiment, the sacrificial hard mask layer is removed using one of the dry etching technique known to one of ordinary skill in the art of electronic device manufacturing, e.g. an oxygen plasma etching.

As shown in FIG. 3F, the grid lines 312 and 313 comprise openings, e.g., an opening 351 defined by patterning the sacrificial mask layer using an advance lithography technique, as described above, and removing the portion of the hard mask 316 and the sacrificial hard mask layer 317 between the grid lines 312. The remaining portions of the device hard mask 316 are used as a mask to form device features on the substrate 311. In an embodiment, depositing of the sacrificial hard mask layer and patterning of the sacrificial hard mask layer are repeated until all mask features to design an integrated circuit are formed.

Figure 3G:
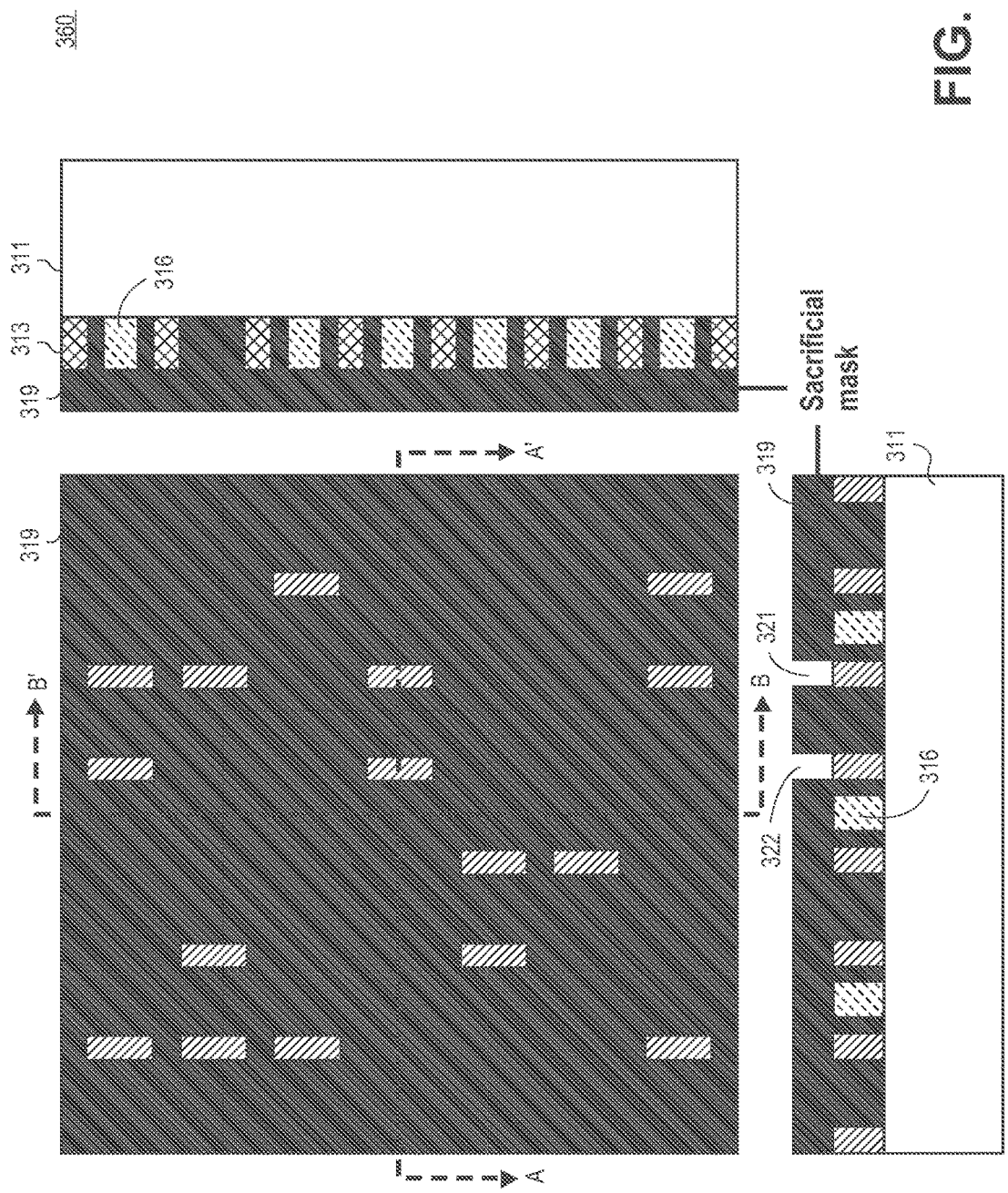
FIG. 3G is a view similar to FIG. 3F after a sacrificial hard mask is deposited and patterned over the grid lines and device hard mask according to one embodiment.

FIG. 3G is a view similar to FIG. 3F after a sacrificial hard mask 319 is deposited and patterned over the grid lines 312 and 313 and device hard mask 316 according to one embodiment. A sacrificial hard mask layer 319 deposited on the grid lines 313, 312, the portions of the device hard mask 316, and on exposed portions of the substrate 311 is similar to one of the sacrificial hard mask layers described above. In an embodiment, the sacrificial hard mask layer 319 is patterned using an advanced lithography, e.g., an electron beam (e-beam) lithography, extreme ultraviolet (EUV) lithography, or any combination thereof, as described above. The patterned sacrificial hard mask layer 319 is etched to form openings, e.g., openings 321 and 322 to expose a portion of the grid lines 312.

Figure 3H:
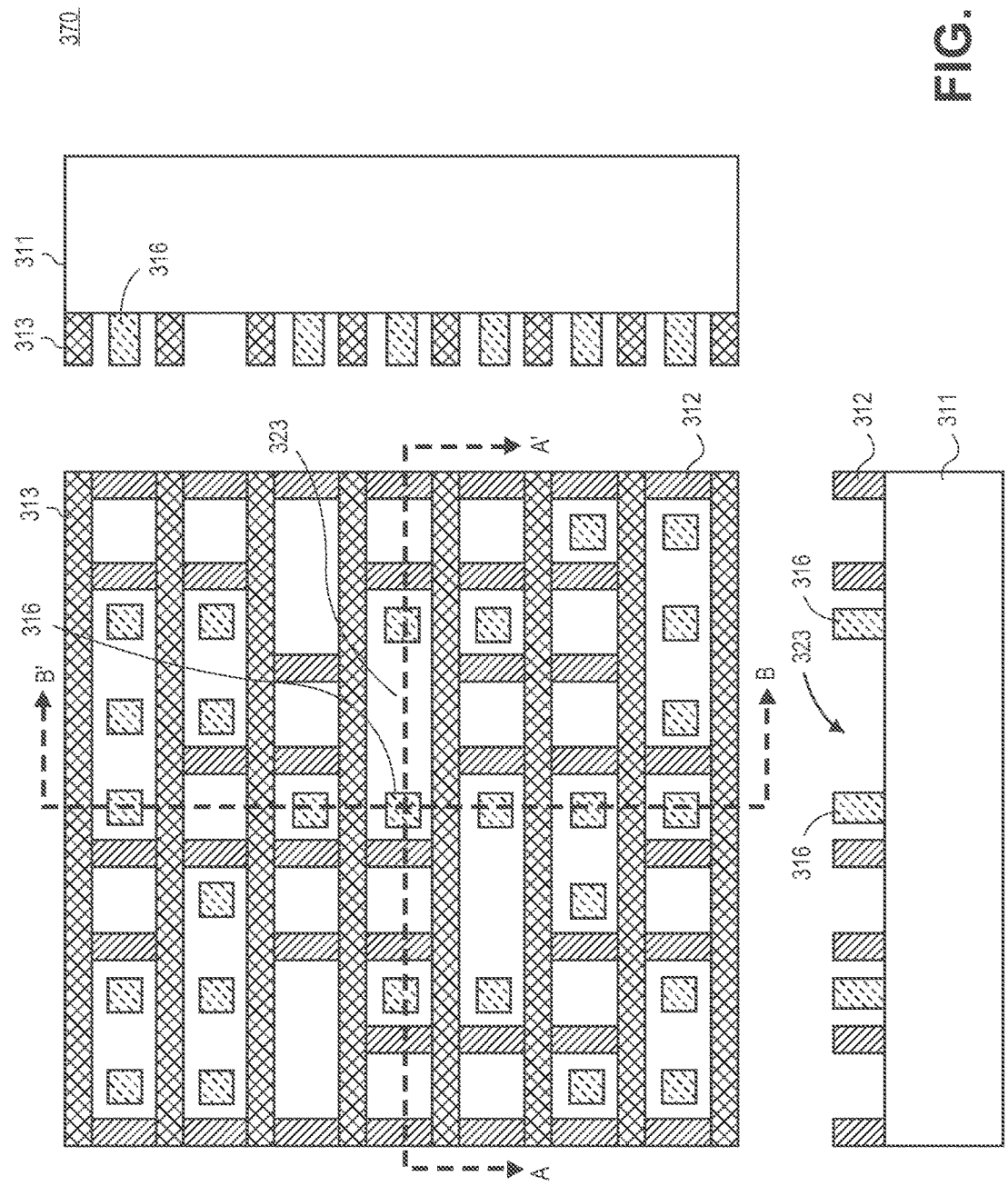
FIG. 3H is a view similar to FIG. 3G after removing the exposed portions of the grid lines and sacrificial hard mask from the substrate according to one embodiment.

FIG. 3H is a view similar to FIG. 3G after removing the exposed portions of the grid lines 312 and sacrificial hard mask from the substrate according to one embodiment. In an embodiment, the exposed portions of the grid lines 312 are etched through the sacrificial hard mask layer 319 down to the substrate 311. In an embodiment, the exposed portions of the grid lines 312 are etched using one of the dry etching techniques known to one of ordinary skill in the art of electronic device manufacturing. In an embodiment, the portions of the grid lines are etched using one of the wet etching techniques known to one of ordinary skill in the art of electronic device manufacturing.

In an embodiment, the sacrificial hard mask is removed using any of the wet techniques known to one of ordinary skill in the art of electronic device manufacturing. In an embodiment, the sacrificial hard mask layer is removed using one of the dry etching technique known to one of ordinary skill in the art of electronic device manufacturing, e.g. an oxygen plasma etching.

As shown in FIG. 3H, the patterned grid lines 312 and 313 comprise openings, e.g., an opening 323 defined by patterning the sacrificial mask layer using an advance lithography technique, as described above, and removing the portions of the grid lines 312 and the sacrificial hard mask layer 319 between the grid lines 312. The remaining portions of the device hard mask 316 and the grid lines 312 are used as a mask to form device features on the substrate 311.

Figure 3I:
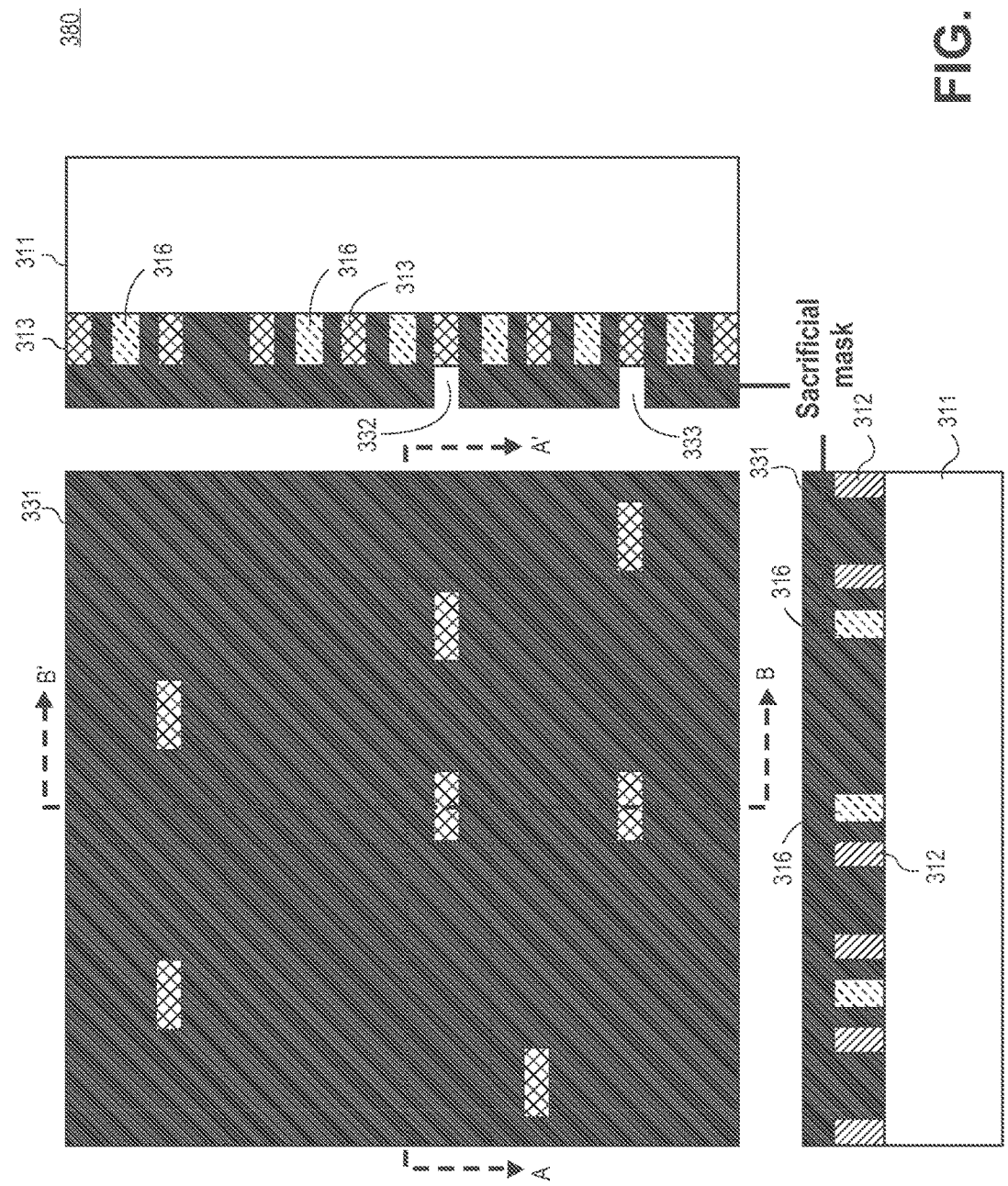
FIG. 3I is a view similar to FIG. 3H after a sacrificial hard mask is deposited and patterned over the grid lines and the remaining portions of the device hard mask on substrate according to one embodiment.

FIG. 3I is a view similar to FIG. 3H after a sacrificial hard mask 331 is deposited and patterned over the grid lines 312 and 313 and the remaining portions of the device hard mask 316 on substrate 311 according to one embodiment. A sacrificial hard mask layer 331 deposited on the remaining portions of grid lines 312, grid lines 313, the remaining portions of the device hard mask 316, and on exposed portions of the substrate 311 is similar to one of the sacrificial hard mask layers described above. In an embodiment, the sacrificial hard mask layer 331 is patterned using an advanced lithography, e.g., electron beam (e-beam) lithography, extreme ultraviolet (EUV) lithography, or any combination thereof, as described above. The patterned sacrificial hard mask layer 331 is etched to form openings, e.g., openings 332 and 333 to expose a portion of the grid lines 313.

Figure 3J:
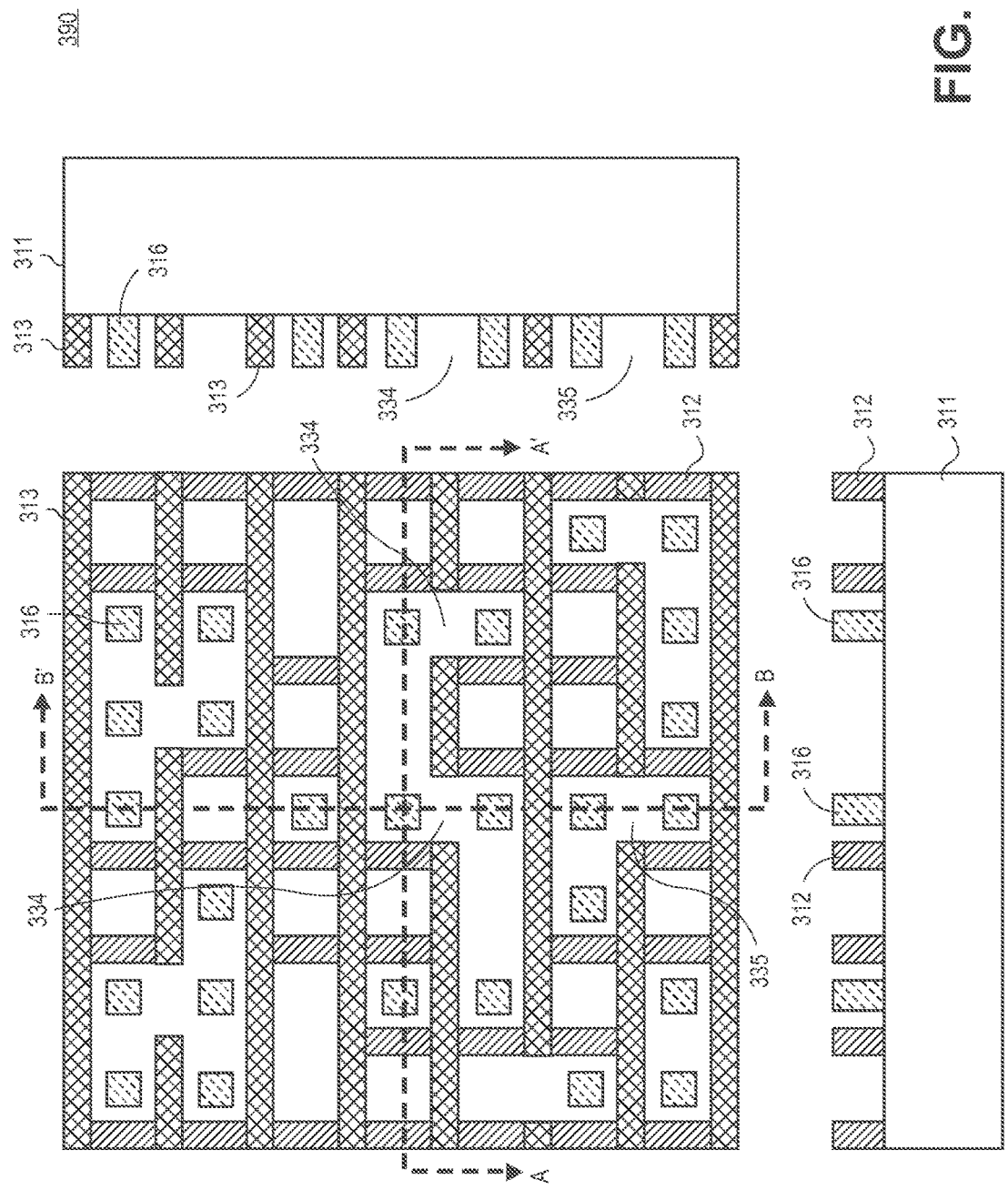
FIG. 3J is a view similar to FIG. 3I after removing the exposed portions of the grid lines and sacrificial hard mask from the substrate according to one embodiment.

FIG. 3J is a view similar to FIG. 3I after removing the exposed portions of the grid lines 313 and sacrificial hard mask from the substrate according to one embodiment. In an embodiment, the exposed portions of the grid lines 313 are etched through the sacrificial hard mask layer 331 down to the substrate 311. In an embodiment, the exposed portions of the grid lines 313 are etched using one of the dry etching techniques known to one of ordinary skill in the art of electronic device manufacturing. In an embodiment, the portions of the grid lines 313 are etched using one of the wet etching techniques known to one of ordinary skill in the art of electronic device manufacturing.

In an embodiment, the sacrificial hard mask is removed using any of the wet techniques known to one of ordinary skill in the art of electronic device manufacturing. In an embodiment, the sacrificial hard mask layer is removed using one of the dry etching technique known to one of ordinary skill in the art of electronic device manufacturing, e.g. an oxygen plasma etching.

As shown in FIG. 3J, the patterned grid lines 312 and 313 comprise openings, e.g., openings 334 and 335 defined by patterning the sacrificial mask layer using an advance lithography technique, as described above, and removing the portions of the grid lines 313 and the sacrificial hard mask layer 331 between the grid lines 313. The remaining portions of the device hard mask 316, the grid lines 312 and 313 are used as a mask to form device features on the substrate 311.

Figure 3K:
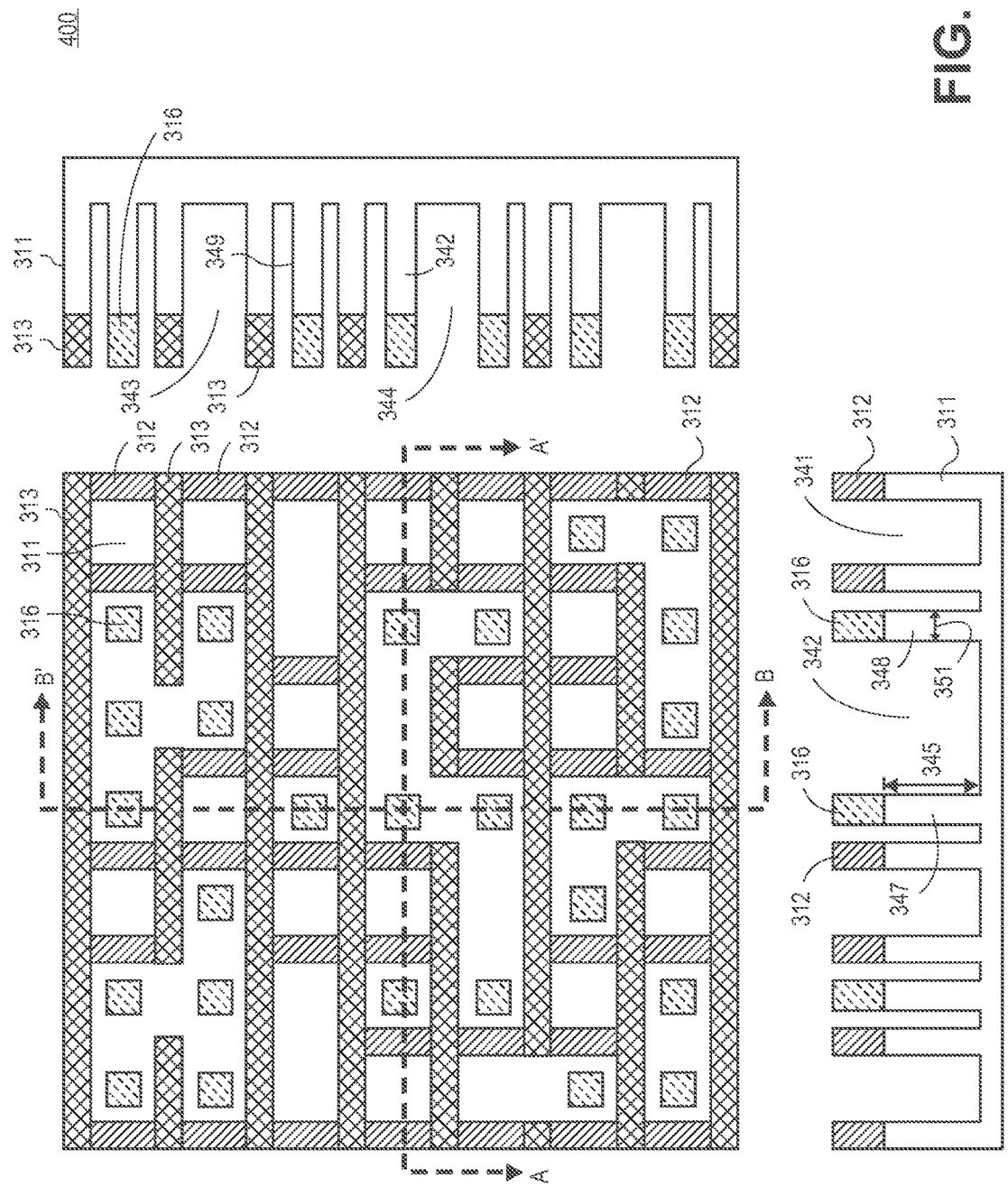
FIG. 3K is a view similar to FIG. 3J after etching the substrate using the portions of the device hard mask and remaining grid lines as a mask according to one embodiment.

FIG. 3K is a view similar to FIG. 3J after etching the substrate using the portions of the device hard mask and remaining grid lines as a mask according to one embodiment. As shown in FIG. 3K, the exposed portions of the substrate 311 are etched through the patterned grid lines 312 and 313 and the remaining portions of the device hard mark 316 to a predetermined depth 345 to form vertical features, such as vertical features 347, 348 and 349. In an embodiment, the vertical features, such as features 347, 348 and 349 are nanowires.

In an embodiment, the size of the vertical features, such as the size 355 is less than 10 nm. In an embodiment, the size of the vertical features is from about 1 nm to about 10 nm. As shown in FIG. 3K, trenches in the substrate 311 are formed, such as trenches 342, 343 and 344. Depending on design, substrate 311 can be etched down a predetermined depth using any of the dry etch or wet etch techniques known to one of ordinary skill in the art of electronic device manufacturing.

Figure 3L:
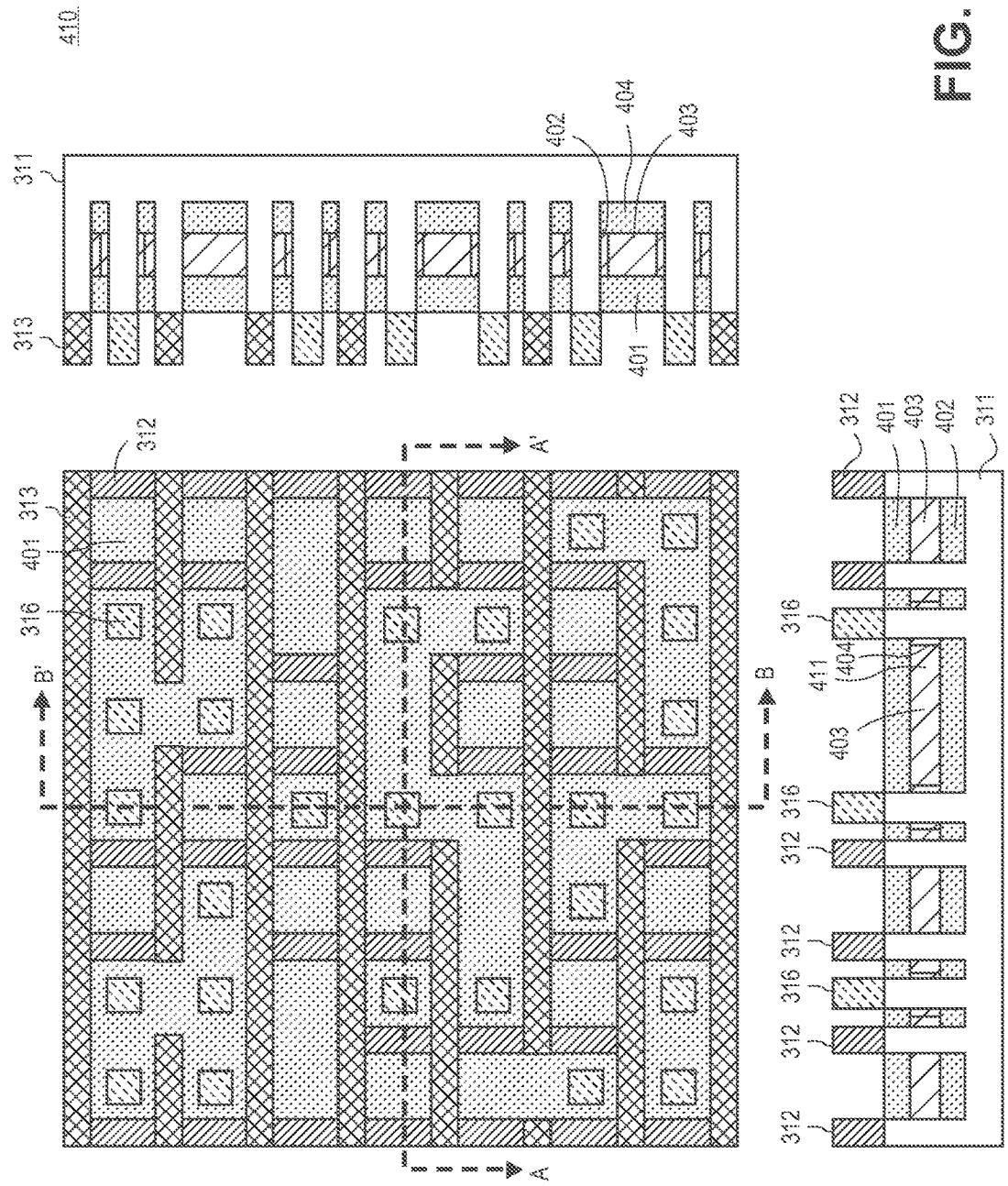
FIG. 3L is a view similar to FIG. 3K after a gate stack is deposited into the trenches according to one embodiment.

FIG. 3L is a view similar to FIG. 3K after a gate stack is deposited into the trenches according to one embodiment. As shown in FIG. 3L, a dielectric layer 402 is deposited onto a bottom of the trenches in the substrate 311, a gate stack 403 is deposited onto the dielectric layer 402, and a dielectric layer 401 is deposited onto the gate stack 403. In an embodiment, dielectric layers 401 and 402 act as a spacer for the gate stack 403.

In one embodiment, the dielectric layers deposited into the trenches in the substrate comprise an interlayer dielectric (ILD), e.g., silicon dioxide. In one embodiment, the dielectric layers deposited into the trenches in the substrate comprise polyimide, epoxy, photodefinable materials, such as benzocyclobutene (BCB), and WPR-series materials, or glass. In one embodiment, the dielectric layers deposited into the trenches in the substrate are low permittivity (low-k) ILD layers.

As shown in FIG. 3L, gate stack 403 deposited between the dielectric layers into the trenches comprises a gate dielectric 404 adjacent to the sidewall the trench in the substrate 311 and a gate electrode 411 adjacent to the gate dielectric 404. The gate dielectric 404 can be any well-known gate dielectric layer, as described above. Gate electrode 411 can be formed of any suitable gate electrode material, as described above.

In an embodiment, the dielectric layers are selectively deposited into the trenches in the substrate using any of the selective deposition techniques known to one of ordinary skill in the art of electronic device manufacturing. In an embodiment, the gate dielectric is selectively deposited between the dielectric layers 401 and 402 into the trenches using any of the deposition techniques known to one of ordinary skill in the art of electronic device manufacturing.

Figure 3M:
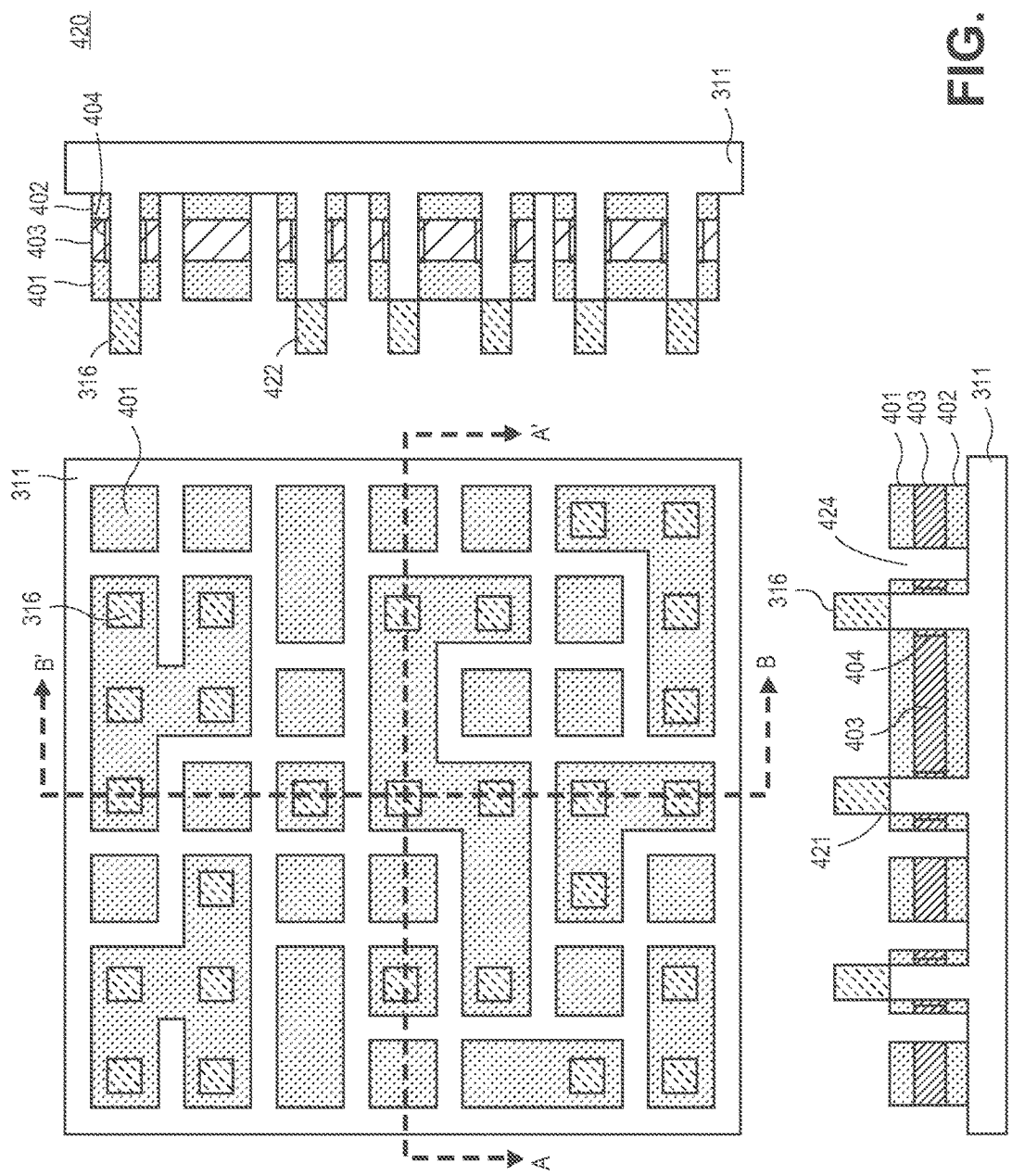
FIG. 3M is a view similar to FIG. 3L after etching all grid lines and underlying portions of the substrate according to one embodiment.

FIG. 3M is a view similar to FIG. 3L after etching all grid lines 312 and 313 and underlying portions of the substrate 311 according to one embodiment. As shown in FIG. 3M, the remaining portions of the grid lines 312 and 313 are removed from the substrate 311, so that gate bundles, such as gate bundles 421, 422, and 423 are separated on the substrate 311 by a space, such as a space 424. In an embodiment, the remaining portions of the grid lines 312 and 313 are removed by using one of the dry etching techniques known to one of ordinary skill in the art of electronic device manufacturing. In an embodiment, the remaining portions of the grid lines 312 and 313 are removed by using one of the wet etching techniques known to one of ordinary skill in the art of electronic device manufacturing.

Figure 3N:
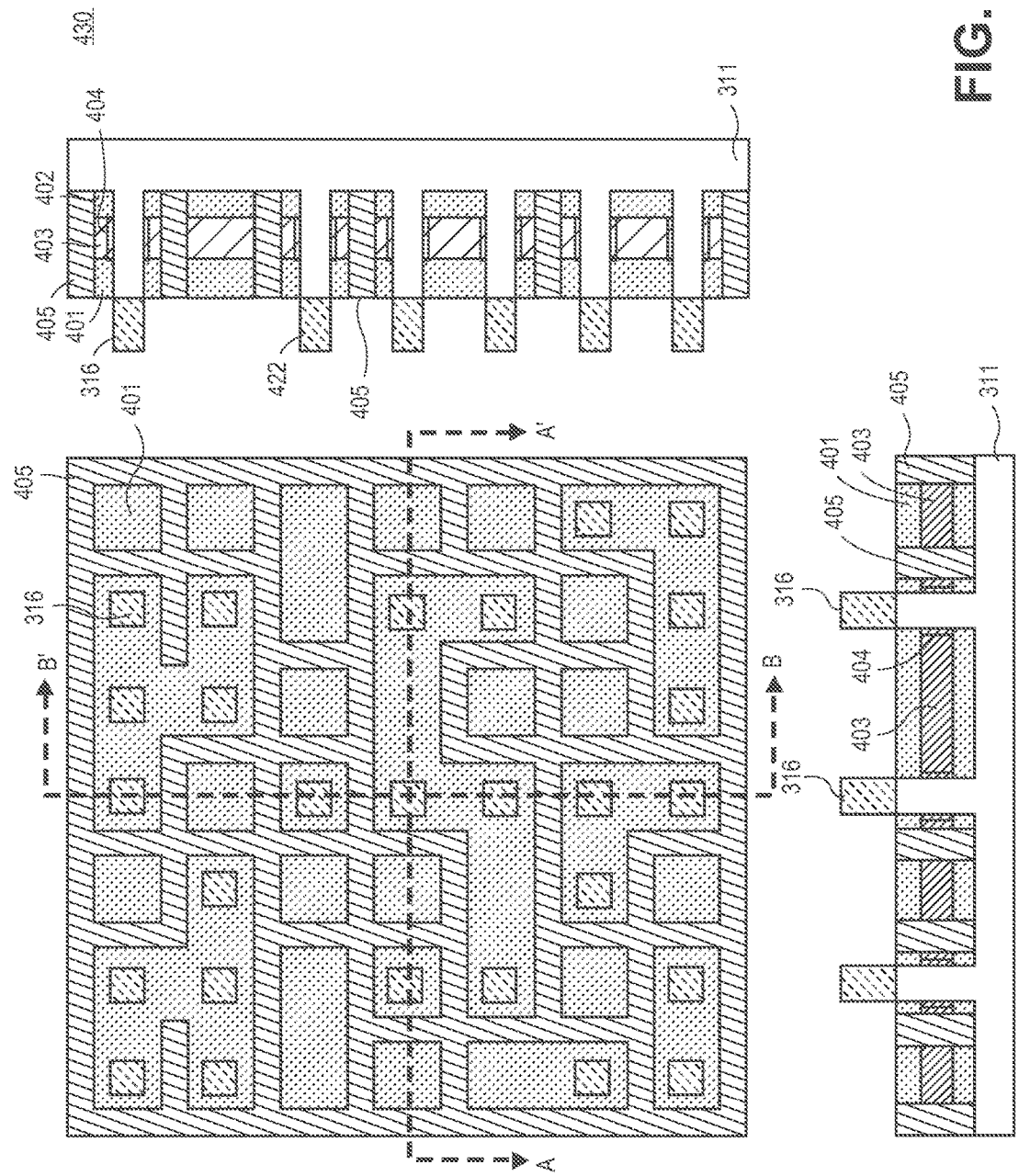
FIG. 3N is a view similar to FIG. 3M after a gate barrier 405 is deposited according to one embodiment.

FIG. 3N is a view similar to FIG. 3M after a gate barrier 405 is deposited according to one embodiment. As shown in FIG. 3N, the gate barrier, such as a gate barrier 405 is deposited into the spaces to electrically separate the gate bundles. In an embodiment, the gate barrier comprises e.g., silicon dioxide, silicon nitride or other electrically insulating layer known to one of ordinary skill in the art of electronic device manufacturing. In an embodiment, the gate barrier is deposited using one of the deposition techniques known to one of ordinary skill in the art of electronic device manufacturing, such as but not limited to a chemical vapour deposition (CVD), a physical vapour deposition (PVD).

Figure 3O:
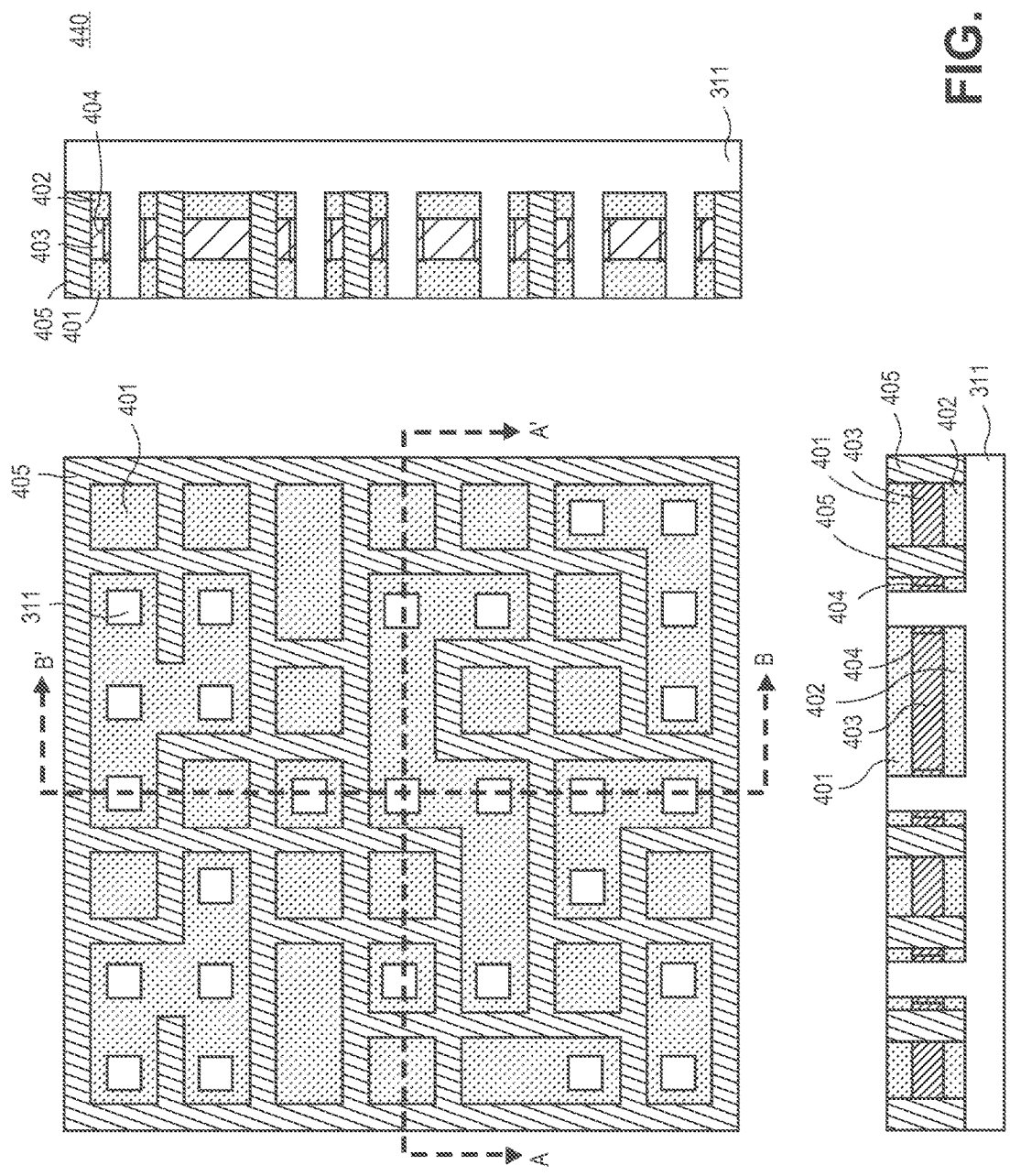
FIG. 3O is a view similar to FIG. 3N after the remaining portions of the device hard mask are removed from the portions of the substrate according to one embodiment.

FIG. 3O is a view similar to FIG. 3N after the remaining portions of the device hard mask are removed from the portions of the substrate according to one embodiment. As shown in FIG. 3O, the remaining portions device hard mask 316 are removed from the top portions of the substrate 311, and the remaining topology is planarized. In an embodiment, a chemical mechanical polishing technique known one of ordinary skill in the art is used to remove the remaining portions of the device hard mask and to planarize the remaining topology. In an embodiment, the remaining portions of the device hard mask are removed using any of the wet or dry (e.g., plasma) etching techniques known to one of ordinary skill in the art of electronic device manufacturing.

Figure 3P:
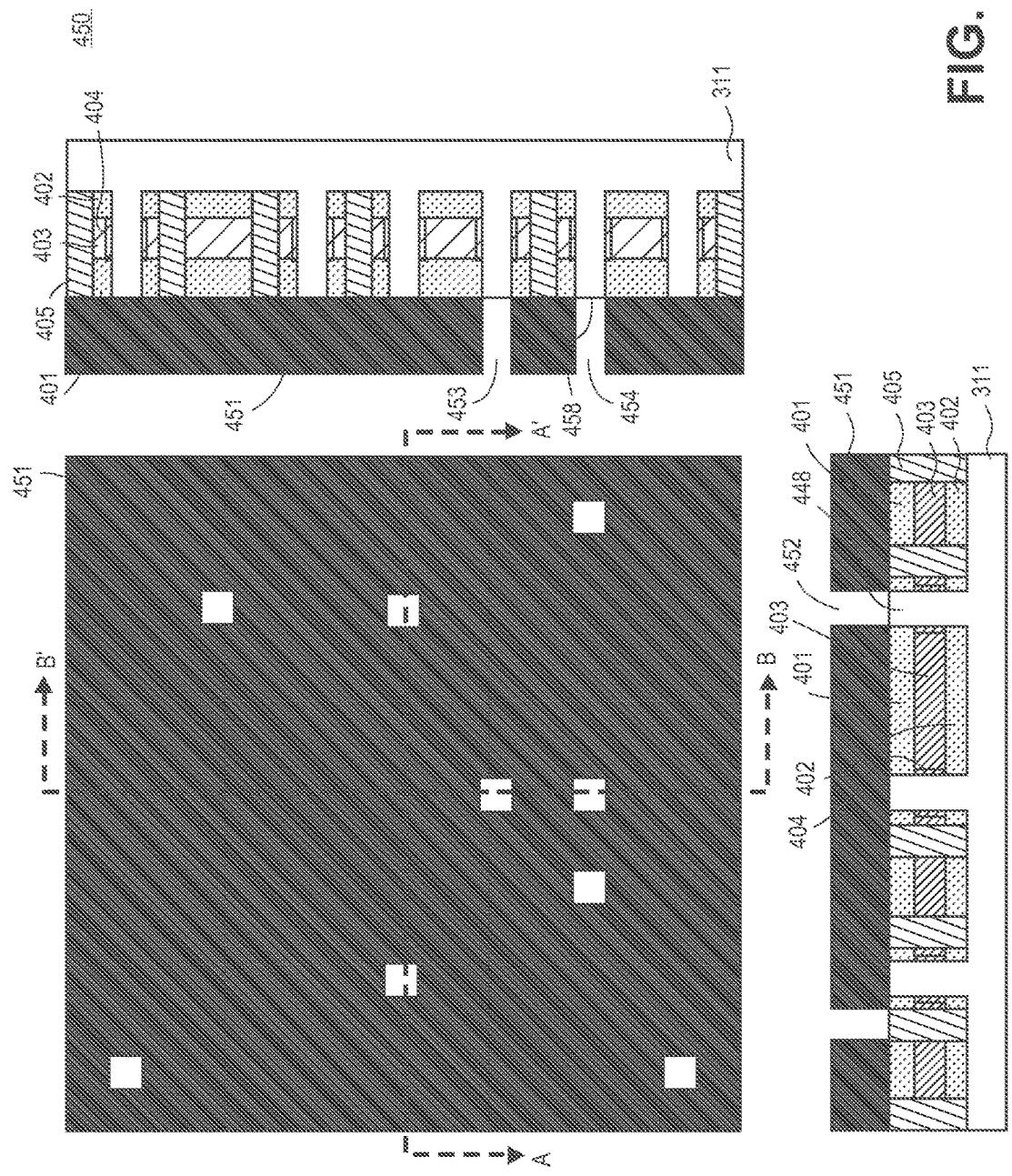
FIG. 3P is a view similar to FIG. 3O after a sacrificial hard mask layer is deposited and patterned to form vias according to one embodiment.

FIG. 3P is a view similar to FIG. 3O after a sacrificial hard mask layer 451 is deposited and patterned to form vias according to one embodiment. A sacrificial hard mask layer 451 deposited on portions of the substrate 311, gate barrier 405, and dielectric 401 is similar to one of the sacrificial hard mask layers described above. In an embodiment, the sacrificial hard mask layer 451 is patterned using an advanced lithography, e.g., electron beam (e-beam) lithography, extreme ultraviolet (EUV) lithography, or any combination thereof, as described above. The patterned sacrificial hard mask layer 451 is etched to form openings, e.g., openings 452, 453 and 454 to expose top portions of some of the vertical features formed on the substrate, such as vertical features 348 and 456.

Figure 3Q:
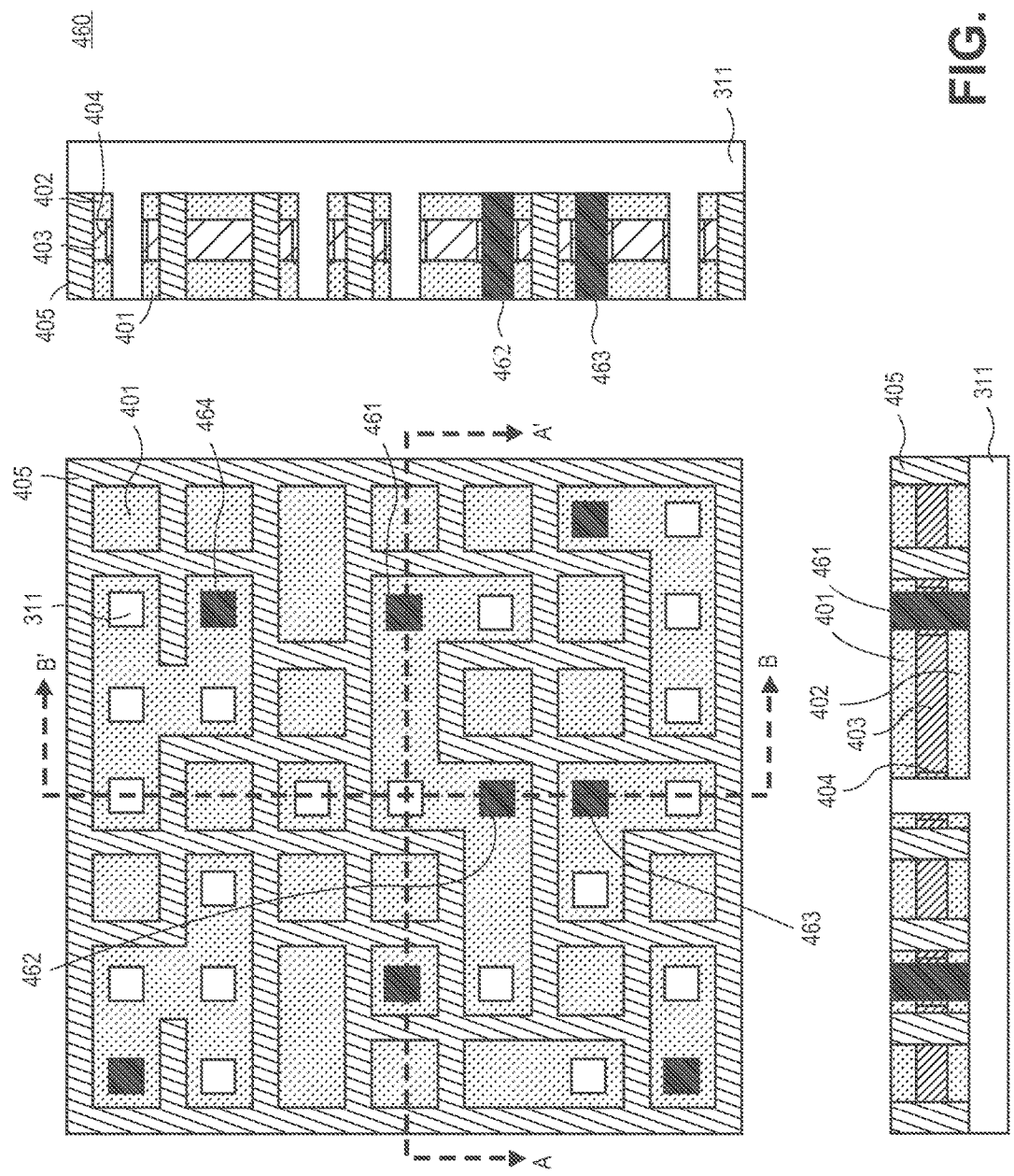
FIG. 3Q is a view similar to FIG. 3P after etching the exposed vertical device features and removing the sacrificial hard mask according to one embodiment.

FIG. 3Q is a view similar to FIG. 3P after removing the sacrificial hard mask and etching the exposed vertical device features according to one embodiment. The exposed vertical features with the adjacent gate dielectric portions are removed to expose portions of the substrate 311. In an embodiment, the exposed vertical features with the adjacent gate dielectric portions are etched through the sacrificial hard mask layer 451 down to the substrate 311. In an embodiment, the exposed vertical features with the adjacent gate dielectric portions are etched using one or more dry etching techniques known to one of ordinary skill in the art of electronic device manufacturing. In an embodiment, the exposed vertical features are etched using one of the wet etching techniques known to one of ordinary skill in the art of electronic device manufacturing.

In an embodiment, the sacrificial hard mask is removed using any of the wet techniques known to one of ordinary skill in the art of electronic device manufacturing. In an embodiment, the sacrificial hard mask layer is removed using one of the dry etching technique known to one of ordinary skill in the art of electronic device manufacturing, e.g. an oxygen plasma etching.

As shown in FIG. 3Q, the openings defined by patterning the sacrificial mask layer using an advance lithography technique, and formed by removing the exposed vertical features and the sacrificial hard mask layer 331 are filled with one or more conductive layers to form vertical interconnects (vias), such as vias 461, 462 and 463. Interconnects can be formed of any suitable interconnect material. In an embodiment, the interconnect comprises a metal, such as but not limited to, copper, tungsten, tantalum, titanium, or other conductive material. In an embodiment, the top surface of the structure comprising portions of the gate barriers, gate bundles and dielectric formed on a substrate is planarized using for example, a CMP technique.

Figure 3R:
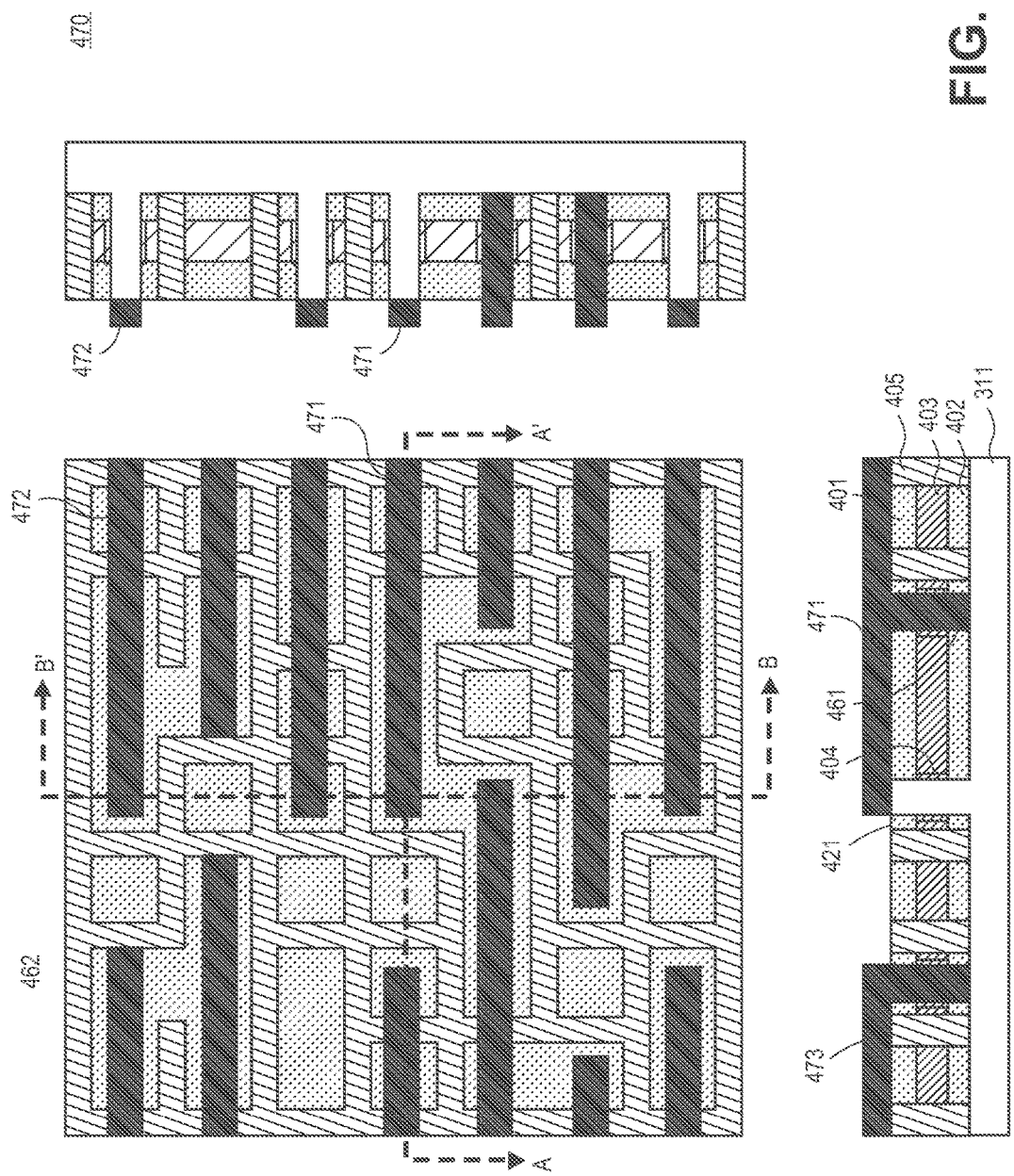
FIG. 3R is a view similar to FIG. 3Q after forming a top interconnect layer over the substrate according to one embodiment.

FIG. 3R is a view similar to FIG. 3Q after forming a top interconnect layer over the substrate according to one embodiment. As shown in FIG. 3R, a top interconnect layer comprises a plurality of conductive lines formed on the top portion of the device structure, such as conductive lines 471, 472 and 473 to connect to electronic devices. The top interconnect layer can be fabricated using one of the interconnect fabrication techniques known to one of the ordinary skill in the art of electronic device manufacturing. The conductive lines can be formed of any suitable interconnect material. In an embodiment, the conductive lines of the top interconnect comprise a metal, such as but not limited to, copper, tungsten, tantalum, titanium, or other conductive material.

Figure 3S:
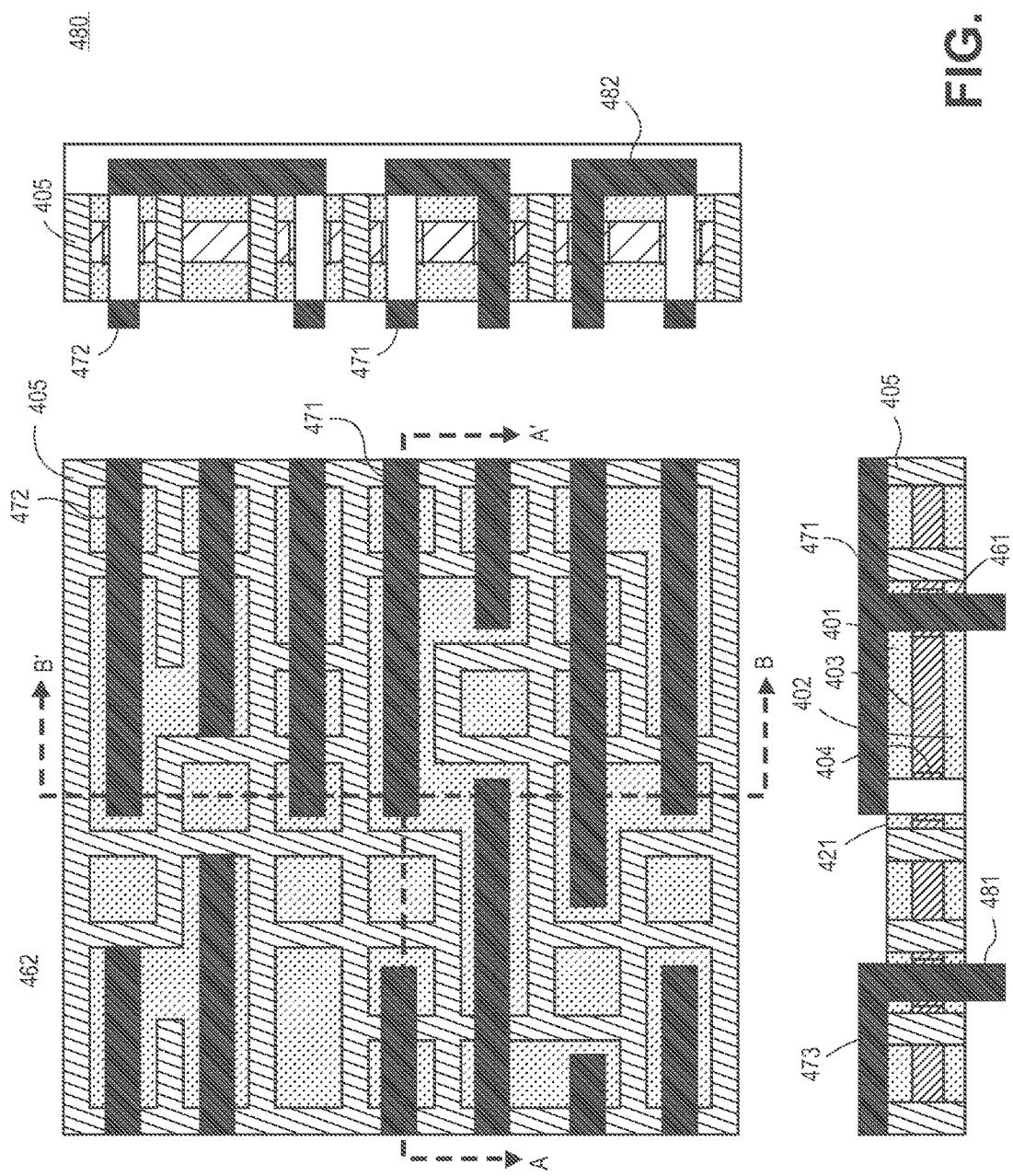
FIG. 3S is a view similar to FIG. 3R, after removing a backside portion of the substrate and forming a bottom interconnect layer according to one embodiment.

FIG. 3S is a view similar to FIG. 3R, after removing a backside portion of the substrate and forming a bottom interconnect layer according to one embodiment. As shown in FIGS. 3R and 3S, the backside portion of the substrate 313 is removed revealing the bottom portions of the vias, such as via 461. The bottom layer of the interconnect comprises a plurality of conductive lines formed on the bottom portion of the device structure, such as conductive lines 481 and 482 to connect to electronic devices. The bottom interconnect layer can be fabricated using one of the interconnect fabrication techniques known to one of the ordinary skill in the art of electronic device manufacturing. The conductive lines can be formed of any suitable interconnect material, as described above.

Figure 4:
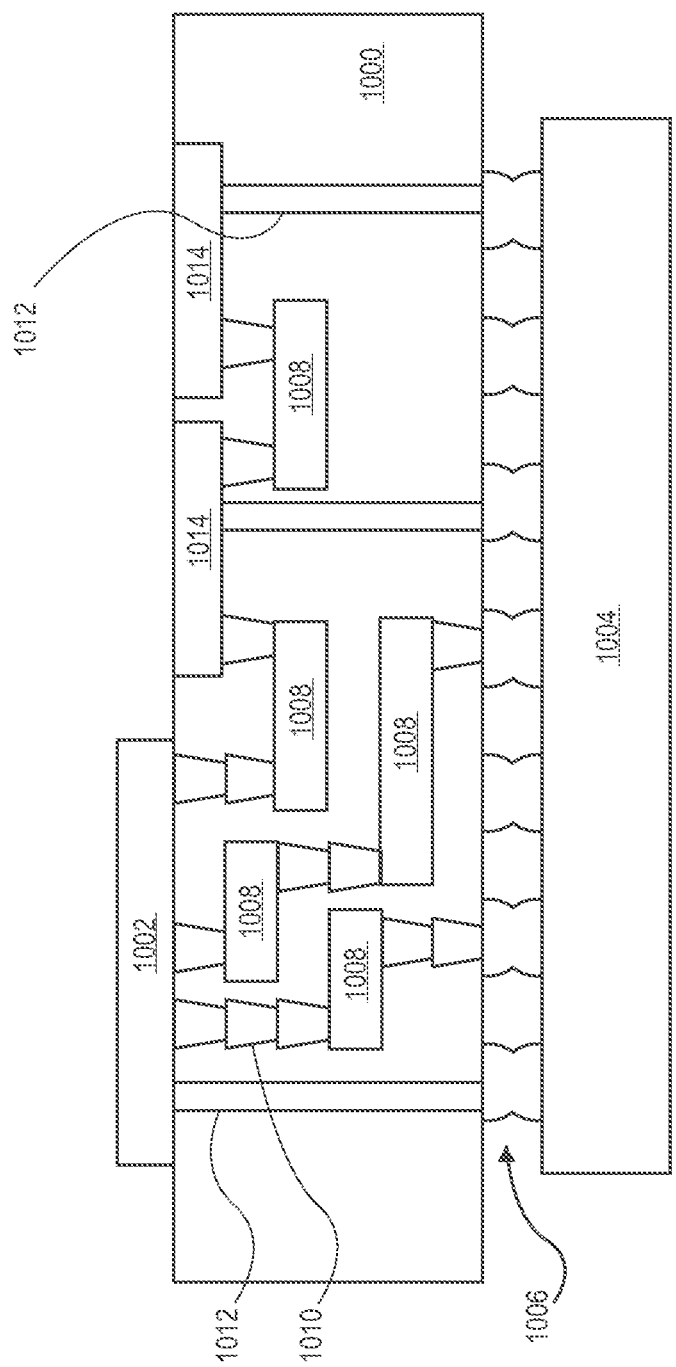
FIG. 4 illustrates an interposer according to one embodiment.

FIG. 4 illustrates an interposer 1000 according to one embodiment. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012 fabricated using methods described herein. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000.

In at least some embodiments, apparatuses and processes disclosed herein may be used in the fabrication of interposer 1000.

Figure 5:
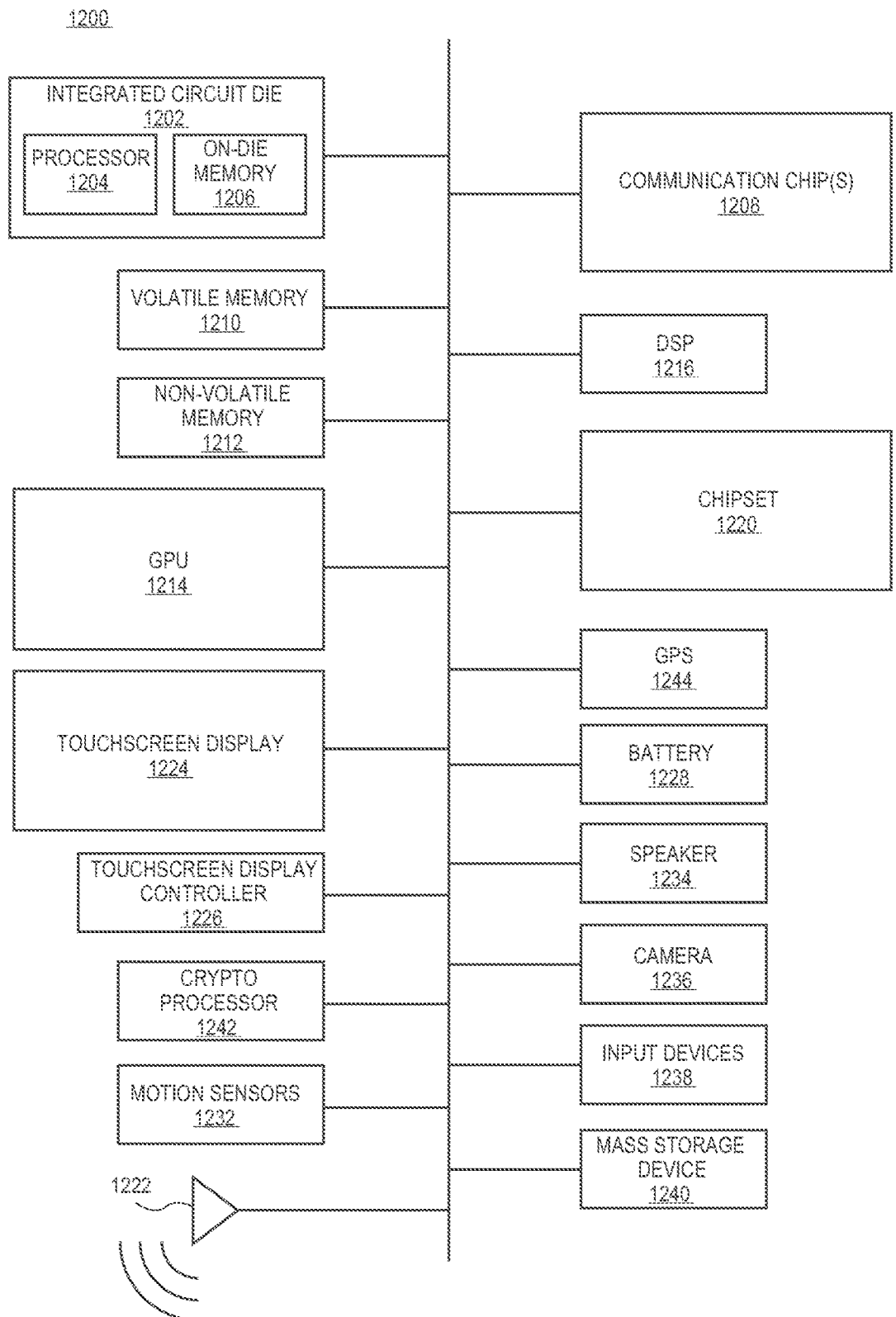
FIG. 5 illustrates a computing device according to one embodiment.

FIG. 5 illustrates a computing device 1200 according to one embodiment. The computing device 1200 may include a number of components. In one embodiment, these components are attached to one or more motherboards. In an alternate embodiment, these components are fabricated onto a single system-on-a-chip (SoC) die rather than a motherboard. The components in the computing device 1200 include, but are not limited to, an integrated circuit die 1202 and at least one communication chip 1208. In some implementations the communication chip 1208 is fabricated as part of the integrated circuit die 1202. The integrated circuit die 1202 may include a CPU 1204 as well as on-die memory 1206, often used as cache memory, that can be provided by technologies such as embedded DRAM (eDRAM) or spin-transfer torque memory (STTM or STTM-RAM).

Computing device 1200 may include other components that may or may not be physically and electrically coupled to the motherboard or fabricated within an SoC die. These other components include, but are not limited to, volatile memory 1210 (e.g., DRAM), non-volatile memory 1212 (e.g., ROM or flash memory), a graphics processing unit 1214 (GPU), a digital signal processor 1216, a crypto processor 1242 (a specialized processor that executes cryptographic algorithms within hardware), a chipset 1220, an antenna 1222, a display or a touchscreen display 1224, a touchscreen controller 1226, a battery 1228 or other power source, a power amplifier (not shown), a global positioning system (GPS) device 1228, a compass 1230, a motion coprocessor or sensors 1232 (that may include an accelerometer, a gyroscope, and a compass), a speaker 1234, a camera 1236, user input devices 1238 (such as a keyboard, mouse, stylus, and touchpad), and a mass storage device 1240 (such as hard disk drive, compact disk (CD), digital versatile disk (DVD), and so forth).

The communications chip 1208 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1208 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips 1208. For instance, a first communication chip 1208 may be dedicated to shorter range wireless communications such as Wi-Fi and Bluetooth and a second communication chip 1208 may be dedicated to longer range wireless communications such as GPS, EDGE, GPRS, CDMA, WiMAX, LTE, Ev-DO, and others.

The processor 1204 of the computing device 1200 includes one or more devices, such as transistors or metal interconnects, that are formed using methods and apparatuses providing the vertical device patterning, as described herein. The term "processor" may refer to any device or portion of a device that processes electronic data from registers and/or memory to transform that electronic data into other electronic data that may be stored in registers and/or memory.

The communication chip 1208 may also include one or more devices, such as transistors or metal interconnects, that are formed using methods and apparatuses providing the vertical device patterning, as described herein. In further embodiments, another component housed within the computing device 1200 may contain one or more devices, such as transistors or metal interconnects, that are formed using methods and apparatuses providing the vertical device patterning, as described herein.

In various embodiments, the computing device 1200 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

The following examples pertain to further embodiments:

A method to provide a vertical device patterning, comprising: forming a grid comprising a first set of grid lines and a second set of grid lines on a substrate using a first lithography process; and defining a vertical device feature by selectively patterning at least one of the first set of grid lines and the second set of grid lines using a second lithography process.

A method to provide a vertical device patterning, comprising: forming a grid comprising a first set of grid lines and a second set of grid lines on a substrate using a first lithography process; and defining a vertical device feature by selectively patterning at least one of the first set of grid lines and the second set of grid lines using a second lithography process, wherein the first lithography process comprises a deep ultraviolet (DUV) lithography, and the second lithography process comprises an electron beam lithography, extreme ultraviolet (EUV) lithography, or any combination thereof.

A method to provide a vertical device patterning, comprising: forming a grid comprising a first set of grid lines and a second set of grid lines on a substrate using a first lithography process; and defining a vertical device feature by selectively patterning at least one of the first set of grid lines and the second set of grid lines using a second lithography process, wherein the first set of grid lines and the second set of grid lines comprises a material selective to the substrate.

A method to provide a vertical device patterning, comprising: forming a grid comprising a first set of grid lines and a second set of grid lines on a substrate using a first lithography process; depositing a first hard mask layer on the grid; patterning the first hard mask layer to expose a portion of the at least one of the first set of grid lines and the second set of grid lines and defining a vertical device feature by selectively patterning at least one of the first set of grid lines and the second set of grid lines using a second lithography process.

A method to provide a vertical device patterning, comprising: forming a grid comprising a first set of grid lines and a second set of grid lines on a substrate using a first lithography process; defining a vertical device feature by selectively patterning at least one of the first set of grid lines and the second set of grid lines using a second lithography process; and removing a portion of the at least one of the first set of grid lines and the second set of grid lines.

A method to provide a vertical device patterning, comprising: forming a grid comprising a first set of grid lines and a second set of grid lines on a substrate using a first lithography process; and defining a vertical device feature by selectively patterning at least one of the first set of grid lines and the second set of grid lines using a second lithography process, wherein the vertical device feature comprises a transistor, an interconnect, a trench, or any combination thereof.

A method to provide a vertical device patterning, comprising: forming a grid comprising a first set of grid lines and a second set of grid lines on a substrate using a first lithography process; defining a vertical device feature by selectively patterning at least one of the first set of grid lines and the second set of grid lines using a second lithography process; and forming the device using the patterned at least one of the first set of grid lines and the second set of grid lines as a mask.

A method to manufacture an electronic device comprising:
forming a grid comprising a first set of grid lines and a second set of grid lines on a substrate; depositing a first hard mask layer over the grid; and patterning the first hard mask layer to expose a portion of at least one of the first set of grid lines and a second set of grid lines.

A method to manufacture an electronic device comprising:
forming a grid comprising a first set of grid lines and a second set of grid lines on a substrate; depositing a first hard mask layer over the grid; patterning the first hard mask layer to expose a portion of at least one of the first set of grid lines and a second set of grid lines; and removing the portion of the at least one of the first set of grid lines and the second set of grid lines to expose a portion of the substrate.

A method to manufacture an electronic device comprising:
forming a grid comprising a first set of grid lines and a second set of grid lines on a substrate; depositing a first hard mask layer over the grid; patterning the first hard mask layer to expose a portion of at least one of the first set of grid lines and a second set of grid lines; removing the portion of the at least one of the first set of grid lines and the second set of grid lines to expose a portion of the substrate; and etching the portion of the substrate using the patterned grid as a mask to form a device feature.

A method to manufacture an electronic device comprising:
forming a grid comprising a first set of grid lines and a second set of grid lines on a substrate; depositing a spacer on the grid; depositing a device hard mask adjacent to the spacer; and removing the spacer to expose a portion of the substrate; depositing a first hard mask layer over the grid, wherein the first hard mask layer is deposited on the exposed portion of the substrate; and patterning the first hard mask layer to expose a portion of at least one of the first set of grid lines and a second set of grid lines.

A method to manufacture an electronic device comprising:
forming a grid comprising a first set of grid lines and a second set of grid lines on a substrate; depositing a first hard mask layer over the grid; and patterning the first hard mask layer to expose a portion of at least one of the first set of grid lines and a second set of grid lines, wherein depositing of the first hard mask layer and patterning of the first hard mask layer are repeated until all device features are formed.

A method to manufacture an electronic device comprising: forming a grid comprising a first set of grid lines and a second set of grid lines on a substrate; depositing a first hard mask layer over the grid; and patterning the first hard mask layer to expose a portion of at least one of the first set of grid lines and a second set of grid lines, wherein the grid is formed using a first lithography process, and the first hard mask layer is patterned using a second lithography process.

A method to manufacture an electronic device comprising: forming a grid comprising a first set of grid lines and a second set of grid lines on a substrate; depositing a first hard mask layer over the grid; and patterning the first hard mask layer to expose a portion of at least one of the first set of grid lines and a second set of grid lines etching the substrate using the patterned grid as a mask.

An apparatus to manufacture an electronic device comprising: a grid comprising a first set of grid lines and a second set of grid lines on a substrate; and a first hard mask layer over the grid, wherein the first hard mask layer is patterned to expose a portion of at least one of the first set of grid lines and a second set of grid lines.

An apparatus to manufacture an electronic device comprising: a grid comprising a first set of grid lines and a second set of grid lines on a substrate; and a first hard mask layer over the grid, wherein the first hard mask layer is patterned to expose a portion of at least one of the first set of grid lines and a second set of grid lines, wherein the portion of the at least one of the first set of grid lines and the second set of grid lines to expose a portion of the substrate.

An apparatus to manufacture an electronic device comprising: a grid comprising a first set of grid lines and a second set of grid lines on a substrate; and a first hard mask layer over the grid, wherein the first hard mask layer is patterned to expose a portion of at least one of the first set of grid lines and a second set of grid lines, wherein the portion of the at least one of the first set of grid lines and the second set of grid lines to expose a portion of the substrate, wherein the portion of the substrate is etched using the patterned grid as a mask to form a device feature.

An apparatus to manufacture an electronic device comprising: a grid comprising a first set of grid lines and a second set of grid lines on a substrate; a spacer on the grid; a device hard mask adjacent to the spacer, wherein the spacer is to be removed to expose a portion of the substrate; and a first hard mask layer over the grid, wherein the first hard mask layer is deposited on the exposed portion of the substrate, wherein the first hard mask layer is patterned to expose a portion of at least one of the first set of grid lines and a second set of grid lines, and wherein the portion of the at least one of the first set of grid lines and the second set of grid lines is to expose a portion of the substrate.

An apparatus to manufacture an electronic device comprising: a grid comprising a first set of grid lines and a second set of grid lines on a substrate; and a first hard mask layer over the grid, wherein the first hard mask layer is patterned to expose a portion of at least one of the first set of grid lines and a second set of grid lines, wherein the grid is formed using a first lithography process, and the first hard mask layer is patterned using a second lithography process.

An apparatus to manufacture an electronic device comprising: a grid comprising a first set of grid lines and a second set of grid lines on a substrate; and a first hard mask layer over the grid, wherein the first hard mask layer is patterned to expose a portion of at least one of the first set of grid lines and a second set of grid lines, wherein the patterned grid is used as a mask to define a device feature formed on the substrate.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. An apparatus to manufacture an electronic device comprising:
    a grid comprising a first set of grid lines and a second set of grid lines on a substrate, the first set of grid lines comprising a first plurality of discrete lines along a first direction, and the second set of grid lines comprising a second plurality of discrete lines along a second direction, the second direction orthogonal to the first direction, wherein the second set of grid lines overlaps the first set of grid lines; and
    a first hard mask layer over the grid, wherein the first hard mask layer is patterned to expose a portion of at least one grid line of the first set of grid lines or a portion of at least one gridline of the second set of grid lines, wherein the portion of the at least one of the first set of grid lines and the second set of grid lines exposes a portion of the substrate.

2. The apparatus of claim 1, wherein the portion of the substrate is etched using a portion of the grid as a mask to form a device feature.

3. The apparatus of claim 1, further comprising a spacer on the grid; and a device hard mask adjacent to the spacer, wherein the spacer is to be removed to expose a portion of the substrate, wherein the first hard mask layer is deposited on the exposed portion of the substrate.

4. The apparatus of claim 1, wherein the grid is formed using a first lithography process, and the first hard mask layer is patterned using a second lithography process.

5. The apparatus of claim 1, wherein a portion of the grid is used as a mask to define a device feature formed on the substrate.

6. An apparatus to manufacture an electronic device comprising:
    a grid comprising a first set of grid lines and a second set of grid lines on a substrate, the first set of grid lines comprising a first plurality of discrete lines along a first direction, and the second set of grid lines comprising a second plurality of discrete lines along a second direction, the second direction orthogonal to the first direction, wherein the second set of grid lines overlaps the first set of grid lines;

a spacer on the grid;

a device hard mask adjacent to the spacer, wherein the spacer is to be removed to expose a portion of the substrate; and a first hard mask layer over the grid, wherein the first hard mask layer is deposited on the exposed portion of the substrate, and wherein the first hard mask layer is patterned to expose a portion of at least one grid line of the first set of grid lines or a portion of at least one gridline of the second set of grid lines.

7. An apparatus to manufacture an electronic device comprising:

a grid comprising a first set of grid lines and a second set of grid lines on a substrate, the first set of grid lines comprising a first plurality of discrete lines along a first direction, and the second set of grid lines comprising a second plurality of discrete lines along a second direction, the second direction orthogonal to the first direction, wherein the second set of grid lines overlaps the first set of grid lines, wherein a portion of the grid is used as a mask to define a device feature formed on the substrate; and a first hard mask layer over the grid, wherein the first hard mask layer is patterned to expose a portion of at least one grid line of the first set of grid lines or a portion of at least one gridline of the second set of grid lines.

* * * * *